US009423860B2

(12) United States Patent
Nishijima et al.

(10) Patent No.: US 9,423,860 B2
(45) Date of Patent: Aug. 23, 2016

(54) MICROCONTROLLER CAPABLE OF BEING IN THREE MODES

(71) Applicant: Semiconductor Energy Laboratory Co., Ltd., Atsugi-shi, Kanagawa-ken (JP)

(72) Inventors: Tatsuji Nishijima, Kanagawa (JP); Hidetomo Kobayashi, Kanagawa (JP); Tomoaki Atsumi, Kanagawa (JP); Kiyoshi Kato, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 321 days.

(21) Appl. No.: 14/013,082

(22) Filed: Aug. 29, 2013

(65) Prior Publication Data
US 2014/0068300 A1    Mar. 6, 2014

(30) Foreign Application Priority Data

Sep. 3, 2012   (JP) .................................. 2012-192956
Oct. 17, 2012  (JP) .................................. 2012-229765
Jan. 21, 2013  (JP) .................................. 2013-008407
Mar. 26, 2013  (JP) .................................. 2013-063267

(51) Int. Cl.
*G06F 1/00*   (2006.01)
*G06F 1/32*   (2006.01)
(Continued)

(52) U.S. Cl.
CPC ............ *G06F 1/3243* (2013.01); *G06F 1/3287* (2013.01); *G11C 5/148* (2013.01); *G11C 11/405* (2013.01); *Y02B 60/1239* (2013.01); *Y02B 60/1282* (2013.01)

(58) Field of Classification Search
CPC ...................................................... G06F 1/3203
USPC ......................................................... 713/322
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    1920908 A     2/2007
CN    102656801 A    9/2012
(Continued)

OTHER PUBLICATIONS

Jankovic et al, Power Saving Modes in Modern Microcontroller Design and chip Diagnostics, May 12-15, 2002, Proc. 23$^{rd}$ international Conference of Microelectronics, Yugoslavia, vol. 2, pp. 593-595.*

(Continued)

*Primary Examiner* — Suresh Suryawanshi
(74) *Attorney, Agent, or Firm* — Fish & Richardson P.C.

(57) ABSTRACT

To provide a microcontroller that can operate in a low power consumption mode. The microcontroller includes a CPU, a memory, and a peripheral circuit such as a timer circuit. A register of the peripheral circuit is formed at an interface with a bus line. A power gate is provided for control of power supply, and the microcontroller can operate in the low power consumption mode where some circuits alone are active, in addition to in a normal operation mode where all circuits are active. A register with no power supply in the low power consumption mode, such as a register of the CPU, includes a volatile memory and a nonvolatile memory.

22 Claims, 28 Drawing Sheets

(51) Int. Cl.
   *G11C 11/405* (2006.01)
   *G11C 5/14* (2006.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,665,802 B1* | 12/2003 | Ober | 713/320 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,536,570 B2* | 5/2009 | Leung et al. | 713/300 |
| 7,623,364 B2 | 11/2009 | Sasaki et al. | |
| 7,674,650 B2 | 3/2010 | Akimoto et al. | |
| 7,732,819 B2 | 6/2010 | Akimoto et al. | |
| 7,872,891 B2 | 1/2011 | Sasaki et al. | |
| 7,873,856 B2* | 1/2011 | Westwick et al. | 713/340 |
| 7,986,287 B2 | 7/2011 | Umezaki et al. | |
| 8,010,819 B2* | 8/2011 | Pastorello et al. | 713/323 |
| 8,362,538 B2 | 1/2013 | Koyama et al. | |
| 8,525,763 B2 | 9/2013 | Umezaki et al. | |
| 8,531,114 B2* | 9/2013 | Deckard et al. | 315/130 |
| 8,543,856 B2* | 9/2013 | Singh et al. | 713/323 |
| 9,021,284 B2* | 4/2015 | Freiwald et al. | 713/323 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0061526 A1 | 3/2003 | Hashimoto | |
| 2003/0065984 A1* | 4/2003 | Takeda et al. | 714/42 |
| 2003/0076705 A1 | 4/2003 | Yamaoka et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0071032 A1 | 4/2004 | Yamaoka et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0232054 A1 | 10/2005 | Yamaoka et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0268647 A1 | 11/2006 | Yamaoka et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0046590 A1 | 3/2007 | Umezaki et al. | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0106884 A1 | 5/2007 | Bracamontes | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0019205 A1 | 1/2008 | Yamaoka et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0148083 A1 | 6/2008 | Pesavento et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0239780 A1 | 10/2008 | Sasaki et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001814 A1 | 1/2009 | Sabramaniam | |
| 2009/0068773 A1 | 3/2009 | Lai et al. | |
| 2009/0073325 A1 | 3/2009 | Kuwabara et al. | |
| 2009/0097302 A1 | 4/2009 | Yamaoka et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0034044 A1 | 2/2010 | Sasaki et al. | |
| 2010/0065844 A1 | 3/2010 | Tokunaga | |
| 2010/0080046 A1 | 4/2010 | Yamaoka et al. | |
| 2010/0092800 A1 | 4/2010 | Itagaki et al. | |
| 2010/0109002 A1 | 5/2010 | Itagaki et al. | |
| 2010/0207776 A1 | 8/2010 | Yorita et al. | |
| 2011/0085400 A1 | 4/2011 | Sasaki et al. | |
| 2011/0099401 A1* | 4/2011 | Steinle et al. | 713/323 |
| 2011/0127521 A1 | 6/2011 | Yamazaki | |
| 2011/0156024 A1 | 6/2011 | Koyama et al. | |
| 2011/0273435 A1 | 11/2011 | Umezaki et al. | |
| 2012/0002090 A1 | 1/2012 | Aoki et al. | |
| 2012/0032163 A1 | 2/2012 | Yamazaki | |
| 2012/0063207 A1 | 3/2012 | Kato et al. | |
| 2012/0140550 A1 | 6/2012 | Endo et al. | |
| 2012/0170355 A1 | 7/2012 | Ohmaru et al. | |
| 2013/0015904 A1 | 1/2013 | Priel et al. | |
| 2013/0127497 A1 | 5/2013 | Koyama | |
| 2013/0191673 A1 | 7/2013 | Koyama et al. | |
| 2013/0326244 A1 | 12/2013 | Koyama et al. | |
| 2014/0009199 A1 | 1/2014 | Ohmaru et al. | |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 05-282214 A | 10/1993 |
| JP | 06-348361 A | 12/1994 |
| JP | 08-264794 A | 10/1996 |
| JP | 10-301659 A | 11/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298410 A | 10/2003 |
| JP | 2004-013404 A | 1/2004 |
| JP | 2004-103957 A | 4/2004 |
| JP | 2004-273614 A | 9/2004 |
| JP | 2004-273732 A | 9/2004 |
| JP | 2007-086758 A | 4/2007 |
| JP | 2009-237692 A | 10/2009 |
| JP | 2010-267136 A | 11/2010 |
| JP | 2011-151796 A | 8/2011 |
| JP | 2012-084862 A | 4/2012 |
| KR | 2012-0028231 A | 3/2012 |
| KR | 2012-0127587 A | 11/2012 |
| TW | 201135733 A | 10/2011 |
| TW | 201225261 A | 6/2012 |
| WO | 2004/114391 A1 | 12/2004 |
| WO | 2011/078373 A1 | 6/2011 |
| WO | WO-2011/089847 | 7/2011 |

OTHER PUBLICATIONS

Holberg et al, Innovative Techniques for Extremely Low Power Consumption with 8-bit Microcontrollers, Feb. 2006, Atmel Corporation, pp. 16.*

Guldahl, understanding MCU sleep modes and energy savings, Mar. 6, 2012, Energy Micro, pp. 5.*

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000°C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits, 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350°C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by The Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
International Search Report (Application No. PCT/JP2013/073239) dated Nov. 5, 2013, 3 pages.
Written Opinion (Application No. PCT/JP2013/073239) dated Nov. 5, 2013, 4 pages.

(56) References Cited

OTHER PUBLICATIONS

Masahiro Takahashi et al.; C-Axis Aligned Crystalline In—Ga—Zn—Oxide FET with High Reliability; AM-FPD '11 Digest of Technical Papers; 2011; pp. 271-274.

Kiyoshi Kato et al.; "Evaluation of Off-State Current Characteristics of Transistor Using Oxide Semiconductor Material, Indium—Gallium—Zinc Oxide"; Jpn. J. Appl. Phys. (Japanese Journal of Applied Physics); 2012; pp. 021201-1-021201-7; vol. 51.

Hiroki Inoue et al.; "Nonvolatile Memory With Extremely Low-Leakage Indium—Gallium—Zinc—Oxide Thin-Film Transistor"; IEEE Journal of Solid-State Circuits; Sep. 2012; pp. 2258-2265; vol. 47, No. 9.

Shunpei Yamazaki et al.; "Research, Development, and Application of Crystalline Oxide Semiconductor"; SID Digest '12 : SID International Symposium Digest of Technical Papers; 2012; pp. 183-186.

E. Kitagawa et al.; "Impact of ultra low power and fast write operation of advanced perpendicular MTJ on power reduction for high-performance mobile CPU"; IEDM2012: Technical Digest of International Electron Devices Meeting; 2012; pp. 677-680.

Y. Shuto et al.; "Design and performance of pseudo-spin-MOSFETs using nano-CMOS devices"; IEDM2012: Technical Digest of International Electron Devices Meeting; 2012; pp. 685-688.

Hidetomo Kobayashi et al.; "Processor with 4.9-μs Break-even Time in Power Gating Using Crystalline In—Ga—Zn—Oxide Transistor"; Cool Chips XVI, IEEE; 2013; pp. 1-3.

Murakami.M et al., "Theoretical Examination on a Significantly Low Off-State Current of a Transistor Using Crystalline In—Ga—Zn—Oxide", AM-FPD '12 Digest of Technical Papers, Jul. 4, 2012, pp. 171-174.

\* cited by examiner

MICROCONTROLLER CAPABLE OF BEING IN THREE MODES

TECHNICAL FIELD

The present invention relates to objects, methods, manufacturing methods, processes, machines, manufacture, or compositions of matter. In particular, the present invention relates to, for example, semiconductor devices, display devices, light-emitting devices, power storage devices, driving methods thereof, or manufacturing methods thereof. In particular, the present invention relates to microcontrollers, for example. Note that the term "microcontroller" means one kind of semiconductor devices and is referred to as "microcontroller unit", "MCU", "μC", and the like.

Note that a semiconductor device in this specification means all devices that can function by utilizing semiconductor characteristics, and all of electronic optical devices, semiconductor circuits, and electronic devices fall within the category of the semiconductor device.

BACKGROUND ART

With the development of a technique for miniaturizing a semiconductor device, the degree of integration of a microcontroller has been increased year by year. Accordingly, the leakage current of a variety of semiconductor elements (e.g., a transistor and the like) provided inside the microcontroller has been increased, which has resulted in a large increase in power consumption of the microcontroller. Thus, one of important issues in recent years is to reduce power consumption of a microcontroller.

As one of methods for reducing power consumption of a microcontroller, there is a technique in which a circuit block unnecessary for operation of the microcontroller, of circuit blocks in the microcontroller, is shifted to a low power consumption mode (see Patent Document 1).

REFERENCE

[Patent Document 1] Japanese Published Patent Application No. H10-301659

DISCLOSURE OF INVENTION

In a circuit block in which power supply is stopped, at the very moment of power supply stop, logics of all nodes in the integrated circuit are volatilized; therefore, timing of stopping the power supply is limited to timing after the complete finish of running processing.

In view of the above, an object of one embodiment of the present invention is to provide a microcontroller of which power consumption is reduced by stopping power supply to a circuit unnecessary for operation. Alternatively, another object of one embodiment of the present invention is to provide a semiconductor device of which operation mode can be switched suitably. Another object of one embodiment of the present invention is to provide a semiconductor device of which operation mode can be switched rapidly. Another object of one embodiment of the present invention is to provide a semiconductor device in which timing for power supply stop can be controlled suitably. Another object of one embodiment of the present invention is to provide a semiconductor device with high response speed. Another object of one embodiment of the present invention is to provide a semiconductor device from which data can be read out accurately. Another object of one embodiment of the present invention is to provide a semiconductor device using a transparent semiconductor layer. Another object of one embodiment of the present invention is to provide a semiconductor device using a highly reliable semiconductor layer. Another object of one embodiment of the present invention is to provide a novel semiconductor device. Note that the descriptions of these objects do not disturb the existence of the other objects. Note that one embodiment of the present invention does not necessarily achieve all the objects describe above. Other objects will be apparent from and can be derived from the description of the specification, the drawings, the claims, and the like.

One embodiment of the invention disclosed in this application is a microcontroller including: a terminal to which a power supply potential is inputted; a CPU; a nonvolatile memory; a first peripheral circuit that measures time and outputs a first interrupt signal; a second peripheral circuit that acts as an interface with an external device and outputs a second interrupt signal; a third peripheral circuit that is a circuit for processing an analog signal inputted externally and outputs a third interrupt signal; an interrupt controller that judges priorities of the first to third interrupt signals and outputs a fourth interrupt signal, first to fifth registers for the first to third peripheral circuits, the CPU, and the interrupt controller; a power gate that supplies the power supply potential to the first to third peripheral circuits and stops the supply of the power supply potential to the first to third peripheral circuits, the CPU, the memory, the interrupt controller, and the first, the fourth, and the fifth registers; a controller that controls the power gate; and a sixth register for the controller, An operation mode of the microcontroller includes at least first to third operation modes. The first operation mode is a mode where all circuits included in the microcontroller are made active; the second operation mode is a mode where the controller, the first peripheral circuit, and the first, the second, and the sixth registers are made active but the other circuits are made non-active; and the third operation mode is a mode where the controller and the sixth register are made active but the other circuits are made non-active. Under an instruction of the CPU, a shift from the first operation mode to the second or the third operation mode is started. By inputting the first interrupt signal to the controller, a shift from the second operation mode to the first operation mode is started. By inputting an external interrupt signal to the controller, a shift from the third operation mode to the first operation mode is started.

The first, the fourth, and the fifth registers each include a volatile memory and a nonvolatile memory, and in a case where power supply is stopped by the power gate, data in the volatile memory is backed up in the nonvolatile memory before the power supply is stopped, and in a case where power supply is started again by the power gate, the data backed up in the nonvolatile memory is written into the volatile memory.

Like the first register or the like, for example, the third register also can include a volatile memory and a nonvolatile memory. In a case where power supply is stopped by the power gate, data in the volatile memory is backed up in the nonvolatile memory before the power supply is stopped, and in a case where power supply is started again by the power gate, the data backed up in the nonvolatile memory is written into the volatile memory.

In the microcontroller, a memory cell in the memory may include a transistor formed using an oxide semiconductor layer and a transistor formed using silicon. Further, the nonvolatile memory may include a transistor formed using an oxide semiconductor layer and a transistor formed using silicon.

In accordance with one embodiment of the present invention, power supply can be stopped to circuits unnecessary for operation of the microcontroller; therefore, lower power consumption of the microcontroller can be achieved.

In addition, a register to which no power is supplied in a low power consumption mode includes a nonvolatile memory, which leads to an increase of flexibility in timing of power supply stop. Therefore, the microcontroller that can return rapidly to the state before power supply stop can be provided.

BRIEF DESCRIPTION OF DRAWINGS

In the accompanying drawings:

FIG. 16A shows Driving 1 performed by a centralized backup method and FIG. 16B shows Driving 2 performed by a distributed backup method;

BEST MODE FOR CARRYING OUT THE INVENTION

Figure 1:
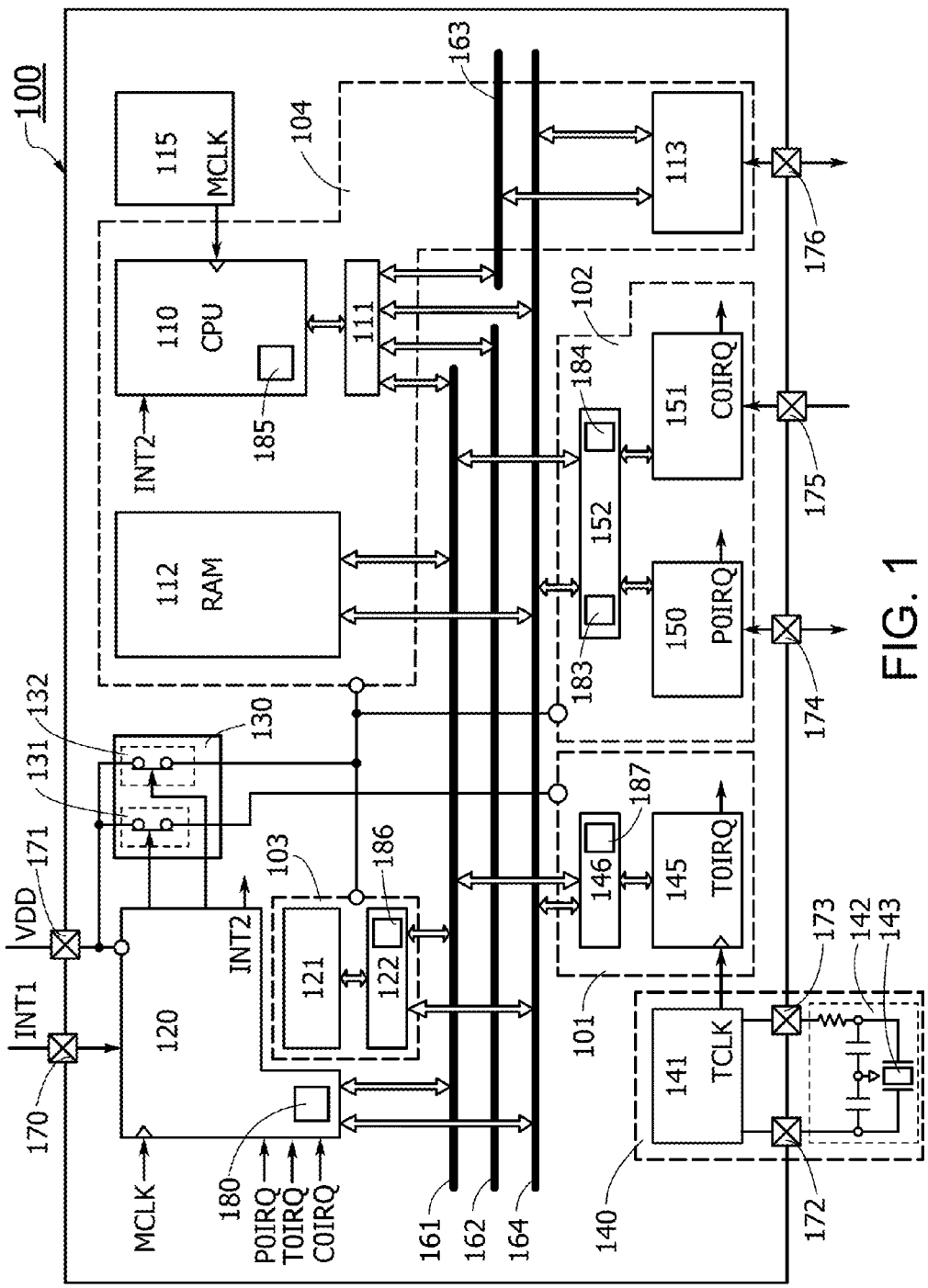
FIG. 1 is a block diagram illustrating an example of a microcontroller configuration.

Hereinafter, embodiments of the present invention will be described in detail with reference to the accompanying drawings. However, the present invention is not limited to the description below and it is easily understood by those skilled in the art that the mode and details can be changed variously. In addition, the present invention should not be interpreted as being limited to description in the embodiments below.

Note that in the drawings used for the description of the embodiments and the examples of the present invention, the same portions or portions having a similar function are denoted by the same reference numerals, and the repeated description thereof is omitted in some cases.

Embodiment 1

A configuration and operation of a microcontroller will be described with reference to FIG. 1. FIG. 1 is a block diagram of a microcontroller 100.

The microcontroller 100 includes a central processing unit (CPU) 110, a bus bridge 111, a random access memory (RAM) 112, a memory interface 113, a controller 120, an interrupt controller 121, an input/output interface (I/O interface) 122, and a power gate unit 130.

The microcontroller 100 further includes a crystal oscillation circuit 141, a timer circuit 145, an I/O interface 146, an I/O port 150, a comparator 151, an I/O interface 152, a bus line 161, a bus line 162, a bus line 163, and a data bus line 164. Further, the microcontroller 100 includes at least connection terminals 170 to 176 as connection parts with external devices. Note that the connection terminals 170 to 176 each represent one terminal or a terminal group including plural terminals.

Figure 2:
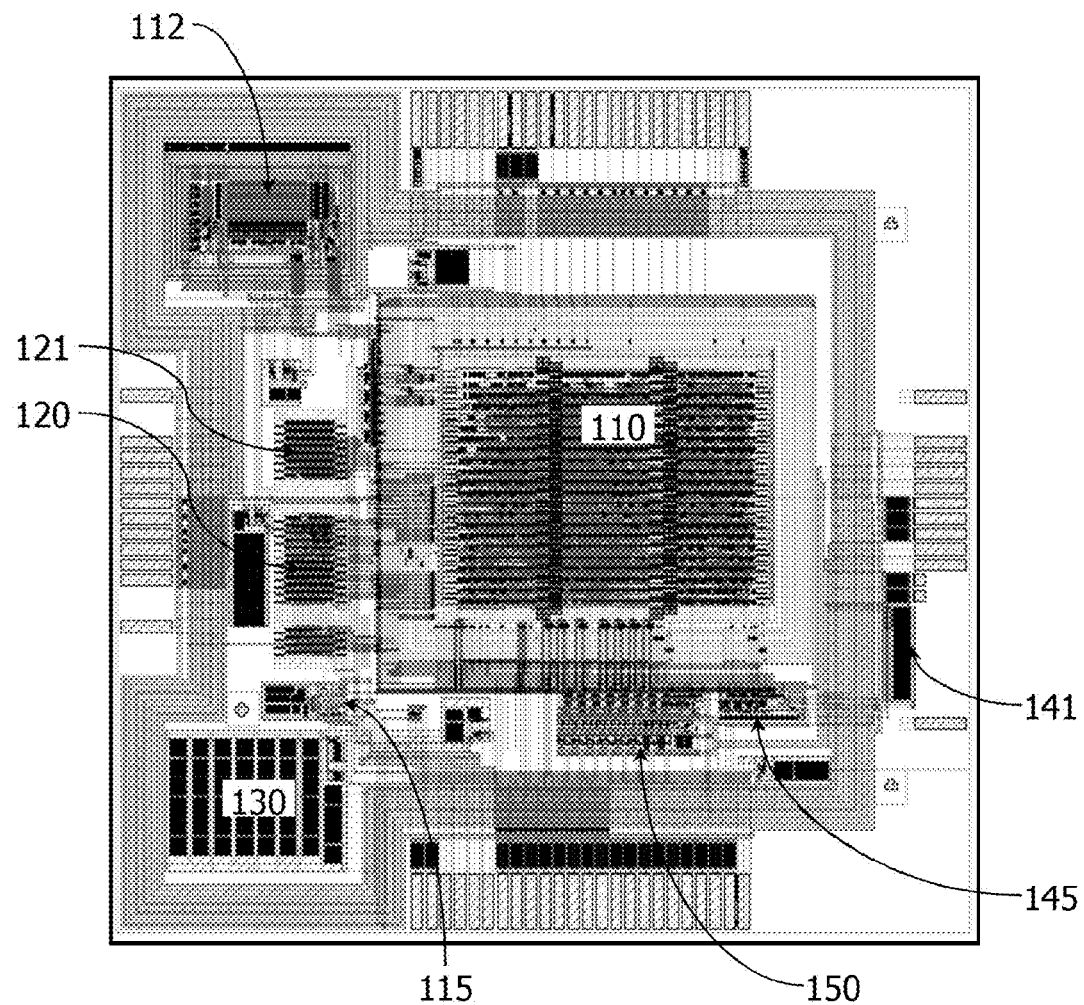
FIG. 2 is a diagram of an example of a layout in the microcontroller.

FIG. 2 is a layout example of circuit blocks included in the microcontroller 100. In the layout in FIG. 2, the reference numerals used for some of the circuit blocks in FIG. 1 are written.

In the layout in FIG. 2, as transistors included in each circuit, a transistor formed using a silicon substrate and a transistor formed using an oxide semiconductor layer are given. In the layout in FIG. 2, the process technology of the transistor formed using silicon is 0.35 μm and the process technology of the transistor formed using an oxide semiconductor layer is 0.8 μm.

The CPU 110 includes a register 185, and is connected to the bus lines 161 to 163 and the data bus line 164 via the bus bridge 111.

The RAM 112 is a memory serving as a main memory of the CPU 110 and is a nonvolatile random access memory.

The RAM 112 is a device that stores an instruction to be executed by the CPU 110, data necessary for execution of the instruction, and data processed by the CPU 110. Under the instruction by the CPU 110, data is written into and read out from the RAM 112.

In the microcontroller 100, power supply to the RAM 112 is stopped in a low power consumption mode. Thus, the RAM 112 is made up of a nonvolatile memory that can store data when no power is supplied.

The memory interface 113 is an input-output interface with an external memory. Under the instruction to be executed by the CPU 110, data is written into and read out from the external memory connected to the connection terminal 176 via the memory interface 113.

A clock generation circuit 115 is a circuit that generates a clock signal MCLK (hereinafter, referred to as MCLK) to be used in the CPU 110, and includes an RC oscillator and the like. MCLK is also inputted into the controller 120 and the interrupt controller 121.

The controller 120 is a circuit that controls the whole microcontroller 100, for example, controls the power of the microcontroller 100, and controls the clock generation circuit 115, and the crystal oscillation circuit 141, and the like. In addition, the controller 120 also controls the power gate unit 130 described later. Into the controller 120 is inputted an external interrupt signal INT1 via the connection terminal 170. The connection terminal 170 is an input terminal of an external interrupt signal. Further, into the controller 120 are inputted interrupt signals (T0IRQ, P0IRQ, C0IRQ) from the peripheral circuits (145, 150, 151), without going through the buses (161 to 164).

The interrupt controller 121 is connected to the bus line 161 and the data bus line 164 via the I/O interface 122. The interrupt controller 121 has a function of setting priorities to interrupt requests. Into the interrupt controller 121 are inputted an external interrupt signal INT1 and interrupt signals (T0IRQ, P0IRQ, and C0IRQ) from the peripheral circuits (145, 150, and 151). When the interrupt controller 121 detects the interrupt signal, the interrupt controller 121 determines if the interrupt request is valid or not. If the interrupt request is valid, the interrupt controller 121 outputs an internal interrupt signal INT2 into the controller 120.

When the controller 120 receives the external interrupt signal INT1, the controller 120 outputs the internal interrupt signal INT2 into the CPU 110 so that the CPU 110 executes interrupt processing.

The register 180 for the controller 120 is formed in the controller 120 and the register 186 for the interrupt controller 121 is formed in the I/O interface 122.

Peripheral circuits of the microcontroller 100 will be described below. The CPU 110 has the timer circuit 145, the I/O port 150, and the comparator 151 as the peripheral circuits. The circuits are examples of the peripheral circuits, and a circuit needed for an electronic device using the microcontroller 100 can be provided as appropriate.

The timer circuit 145 has a function of measuring time in response to a clock signal TCLK (hereinafter, referred to as TCLK). In addition, the timer circuit 145 has a function of outputting the interrupt signal T0IRQ into terminals for requesting interrupt of the controller 120 and the interrupt controller 121 at a set time interval. The timer circuit 145 is connected to the bus line 161 and the data bus line 164 via the I/O interface 146.

In addition, the TCLK used in the timer circuit 145 is generated by a clock generation circuit 140. TCLK is a clock signal of which frequency is lower than that of MCLK. For example, the frequency of MCLK is about several megahertz (MHz) (e.g., 8 MHz) and the frequency of TCLK is about several tens of kilohertz (kHz) (e.g., 32 kHz). The clock generation circuit 140 includes the crystal oscillation circuit 141 incorporated in the microcontroller 100 and an oscillator 142 connected to the connection terminals 172 and 173. The oscillation unit of the oscillator 142 is a quartz crystal unit 143. In addition, the clock generation circuit 140 is made up of a CR oscillator and the like, and thereby, all modules in the clock generation circuit 140 can be incorporated in the microcontroller 100.

The I/O port 150 is an interface for connecting an external device to the connection terminal 174 in a state where information can be input and output, and an input/output interface for a digital signal. The I/O port 150 outputs interrupt signals P0IRQ to the terminals for requesting interrupt of the controller 120 and the interrupt controller 121 in response to an inputted digital signal.

The comparator 151 is a peripheral circuit that processes an analog signal inputted from the connection terminal 175. The comparator 151 compares a potential (or current) of the analog signal inputted from the connection terminal 175 with a potential (or current) of a reference signal and generates a digital signal of which the level is 0 or 1. Further, the comparator 151 generates an interrupt signal C0IRQ when the level of the digital signal is 1. The interrupt signals C0IRQ are outputted to the terminals for requesting interrupt of the controller 120 and the interrupt controller 121.

The I/O port 150 and the comparator 151 are connected to the bus line 161 and the data bus line 164 via the I/O interface 152 common to the both. Here, one I/O interface 152 is used because the I/O interfaces of the I/O port 150 and the comparator 151 can share a circuit; however, the I/O port 150 and the comparator 151 can have an I/O interface different from each other.

In addition, a register of each peripheral circuit is placed in the input/output interface corresponding to the peripheral circuit. A register 187 of the timer circuit 145 is placed in the I/O interface 146, and a register 183 of the I/O port 150 and a register 184 of the comparator 151 are placed in the I/O interface 152.

The microcontroller 100 includes the power gate unit 130 that can stop power supply to the internal circuits. Power is supplied to a circuit necessary for operation by the power gate unit 130, so that power consumption of the whole microcontroller 100 can be lowered.

As illustrated in FIG. 1, the circuits included in the units 101 to 104 surrounded by the dashed lines in the microcontroller 100 are connected to the connection terminal 171 via the power gate unit 130. The connection terminal 171 is a power supply terminal for supplying a high power supply potential VDD (hereinafter, referred to as VDD).

The power gate unit 130 is controlled by the controller 120. The power gate unit 130 includes switch circuits 131 and 132 for blocking supply of VDD to the units 101 to 104. ON/OFF of the switch circuits 131 and 132 is controlled by the controller 120. Specifically, the controller 120 outputs a control signal of the switch circuits 131 and 132 to the power gate unit 130 by using a request of the CPU 110, the external interrupt signal INT1, and the interrupt signal T0IRQ from the timer circuit 145 as a trigger.

In FIG. 1, the power gate unit 130 includes two switch circuits 131 and 132; however, the number of switch circuits can be set as needed for power supply stop. In this embodiment, the switch circuits can be provided so that power can be supplied to the timer circuit 145 and I/O interface 146 (unit 101) independently from other circuits.

FIG. 1 illustrates a state where power supply to the units 102 to 104 is stopped by the common switch circuit 132, but there is no limitation on the power supply path. For example, power supply to the RAM 112 can be controlled by another switch circuit, which is different from the switch circuit 132 for the CPU 110. Further, a plurality of switch circuits can be provided for one circuit.

In addition, VDD is constantly supplied from the connection terminal 171 to the controller 120 without going through the power gate unit 130. In order to reduce noise, a power supply potential from an external power supply circuit, which is different from the power supply circuit for VDD, is given to each of the oscillation circuit of the clock generation circuit 115 and the crystal oscillation circuit 141.

By provision of the controller 120, the power gate unit 130, and the like, the microcontroller 100 can operate in three kinds of operation modes. The first operation mode is a normal operation mode where all circuits included in the microcontroller 100 are active. This mode is referred to as "Active mode".

The second and third operation modes are low power consumption modes where some of the circuits are active. In one of the low power consumption modes, the controller 120, the timer circuit 145, and circuits (the crystal oscillation circuit 141 and the I/O interface 146) associated thereto are active. In the other of the low power consumption modes, the controller 120 alone is active. Here, the former low power consumption mode is referred to as "Noff1 mode" and the latter low power consumption mode is referred to as "Noff2 mode".

Table 1 below shows a relation between each mode and active circuits. In Table 1, ON is given to circuits that are active. As shown in Table 1, the controller 120 and some of the peripheral circuits (circuits necessary for timer operation) alone operate in Noff1 mode and the controller 120 alone operates in Noff2 mode.

TABLE 1

|  | Active | Noff1 | Noff2 |
| --- | --- | --- | --- |
| CPU 110 | ON | — | — |
| Bus bridge 111 | ON | — | — |
| RAM 112 | ON | — | — |
| Memory interface 113 | ON | — | — |
| Clock generation circuit 115 | ON | — | — |
| Crystal oscillation circuit 141 | ON | ON | — |
| Controller 120 | ON | ON | ON |
| Interrupt controller 121 | ON | — | — |
| I/O interface 122 | ON | — | — |
| Timer circuit 145 | ON | ON | — |
| I/O interface 146 | ON | ON | — |
| I/O port 150 | ON | — | — |
| Comparator 151 | ON | — | — |
| I/O interface 152 | ON | — | — |

Note that power is constantly supplied to the oscillator of the clock generation circuit 115 and the crystal oscillation circuit 141 regardless of the operation modes. In order to bring the clock generation circuit 115 and the crystal oscillation circuit 141 into non-active modes, an enable signal is inputted from the controller 120 or an external circuit to stop oscillation of the clock generation circuit 115 and the crystal oscillation circuit 141.

In addition, in Noff1 and Noff2 modes, power supply is stopped by the power gate unit 130, so that the I/O port 150 and the I/O interface 152 are non-active, but power is supplied to parts of the I/O port 150 and the I/O interface 152 in order to allow the external device connected to the connection terminal 174 to operate normally. Specifically, power is supplied to an output buffer of the I/O port 150 and the register 186 of the I/O port 150. In the Noff1 and Noff2 modes, actual functions of the I/O port 150, that is, functions of data transmission between the I/O interface 152 and the external device and generation of an interrupt signal, are stopped. In addition, a communication function of the I/O interface 152 is also stopped similarly.

Note that in this specification, the phrase "a circuit is non-active" includes a state where major functions in Active mode (normal operation mode) are stopped and an operation state with power consumption lower than that of Active mode, as well as a state that a circuit is stopped by power supply stop.

Further, in order that the microcontroller 100 can return from the Noff1 or Noff2 mode to Active mode more rapidly, the registers 185 to 187 each have a backup storage portion for saving data at the time of power supply stop. In other words, the registers 185 to 187 each includes a volatile data storage portion (volatile memory) and a nonvolatile data storage portion (nonvolatile memory). In Active mode, by accessing the volatile memories of the registers 185 to 187, data is written and read out.

On the other hand, because data stored in the register 184 of the comparator 151 is not required to be stored at the time of power supply stop, the register 184 includes no nonvolatile memories. In addition, as described above, in Noff1 and Noff2 modes, the I/O port 150 acts as an output buffer and the register 183 also operates, and thus the register 183 includes no nonvolatile memories.

In the shift from Active mode to Noff1 or Noff2 mode, prior to power supply stop, data stored in the volatile memories of the registers 185 to 187 are written into the nonvolatile memories, so that data in the volatile memories are reset to initial values. Then, power supply is stopped.

In the return from Noff1 or Noff2 mode to Active mode, when power is supplied again to the registers 185 to 187, data in the volatile memories are reset to initial values. Then, data in the nonvolatile memories are written into the volatile memories.

Accordingly, even in the low power consumption mode, data necessary for processing of the microcontroller 100 are stored in the registers 185 to 187, and thus, the microcontroller 100 can be returned instantly from the low power consumption mode to Active mode.

The switching of operation modes is controlled by the CPU 110 and the controller 120. The switching of operation modes will be described with reference to FIG. 3, FIG. 4, and FIG. 5.

Figure 3:
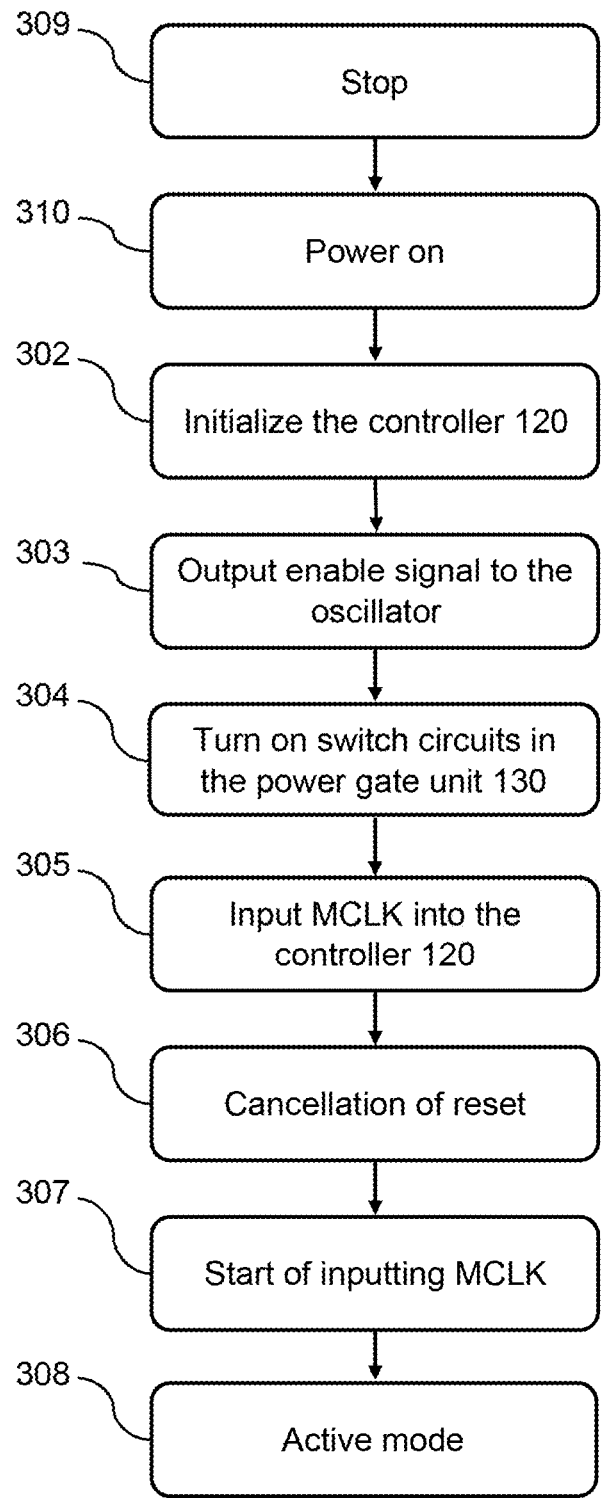
FIG. 3 is a flow chart of an example of processing at the time of power supply.

FIG. 3 is a flow chart showing processing by the controller 120 when power is supplied to the microcontroller 100. First, power is supplied to some circuits of the microcontroller 100 from an external power supply (Steps 309 and 310). In Step 309, VDD is supplied to only a control portion of the power gate unit 130 in the controller 120. In addition, power is also supplied to an oscillator of the clock generation circuit 115 and the crystal oscillation circuit 141. In the controller 120, the control portion of the power gate unit 130 is initialized (Step 302).

The controller 120 outputs an enable signal for starting oscillation to the clock generation circuit 115 and the crystal oscillation circuit 141 (Step 303). In addition, the controller 120 outputs a control signal to the power gate unit 130, so that all switch circuits (131 and 132) in the controller 120 are turned on (Step 304). In Step 303, MCLK is generated by the clock generation circuit 115, and TCLK is generated by the clock generation circuit 140. In addition, in Step 304, VDD is supplied to all circuits connected to the connection terminal 171. Then, inputting MCLK into the controller 120 is started so that all the circuits in the controller 120 are active (Step 305).

The controller 120 cancels reset of each circuit in the microcontroller 100 (Step 306), so that inputting MCLK into the CPU 110 is started (Step 307). By inputting MCLK, the CPU 110 starts to operate and thus the microcontroller 100 operates in Active mode (Step 308).

The shift from Active mode to the power consumption mode (Noff1 or Noff 2 mode) is determined by execution of a program by the CPU 110. The CPU 110 writes a request for shifting the operation mode to the low power consumption mode in an address for requesting the low power consumption mode in the register 180 of the controller 120 (hereinafter, the address is referred to as Noff_TRIG). In addition, the CPU 110 writes data for shifting the operation mode to either Noff1 mode or Noff2 mode in a predetermined address of the register 180 (hereinafter, the address is referred to as Noff_MODE).

The controller 120 starts to shift the operation mode to Noff1 mode or Noff2 mode by using data written in Noff_TRIG of the register 180 as a trigger.

In the register 180, the data storage portion for a shift of the operation mode includes a volatile memory alone. Accordingly, by power supply stop, Noff_TRIG and Noff_MODE are initialized. Here, the initial value of Noff_MODE is Active mode. By setting in this manner, the operation mode can be returned from the low power consumption mode to Active mode, even when the CPU 110 does not operate and data is not written into Noff_TRIG.

Figure 4:
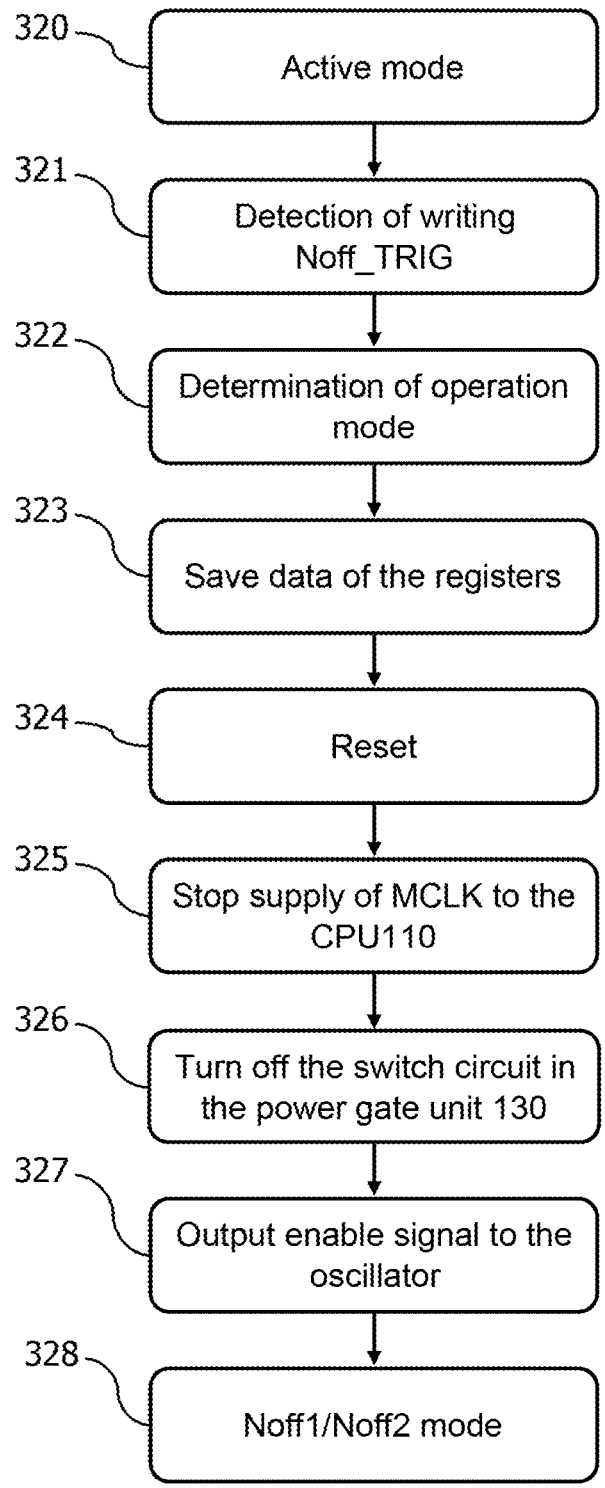
FIG. 4 is a flow chart of an example of a shift from Active mode to Noff1/Noff2 modes.

FIG. 4 is a flow chart showing the shift from Active mode to Noff1 or Noff2 mode. In Active mode, by detection of writing data in Noff_TRIG of the register 180 (Steps 320 and 321), the controller 120 determines an operation mode to be shifted from Active mode, depending on a value of Noff_MODE (Step 322). Here, in processing in FIG. 4, an example of the shift to Noff1 mode is described; however, the same can be applied to the shift to Noff2 mode.

The controller 120 outputs a control signal for requesting saving data to the registers 185 and 186 to which no power is supplied (Step 323) in Noff1 mode. When the registers 185 and 186 receive a control signal from the controller 120, data of the volatile memories are saved (backed up) in the nonvolatile memories.

Next, the controller 120 outputs a control signal for resetting a circuit to which no power is supplied in Noff1 mode (Step 324), and stops supply of MCLK to the CPU 110 (Step 325). The controller 120 outputs a control signal to the power gate unit 130, so that the switch circuit 132 is turned off (Step 326). In Step 326, power supply to the units 102 to 104 is stopped. Then, the controller 120 outputs an enable signal for stopping oscillation to the clock generation circuit 115 (Step 327). Through these steps, the operation mode is shifted to Noff1 mode (Step 328).

When the shift to Noff2 mode is determined in Step 322, data is backed up also in the register 187 for the timer circuit 145 in Step 323. In Step 326, the switch circuit 131 is also turned off. In Step 327, the enable signal for stopping oscillation is outputted to the crystal oscillation circuit 141 too.

The shift from Noff1 or Noff2 mode to Active mode is triggered by an interrupt signal received by the controller 120. In Noff1 mode, an external interrupt signal INT1 or an interrupt signal T0IRQ from the timer circuit 145 serves as a trigger, and in Noff2 mode, and an external interrupt signal INT1 serves as a trigger.

Figure 5:
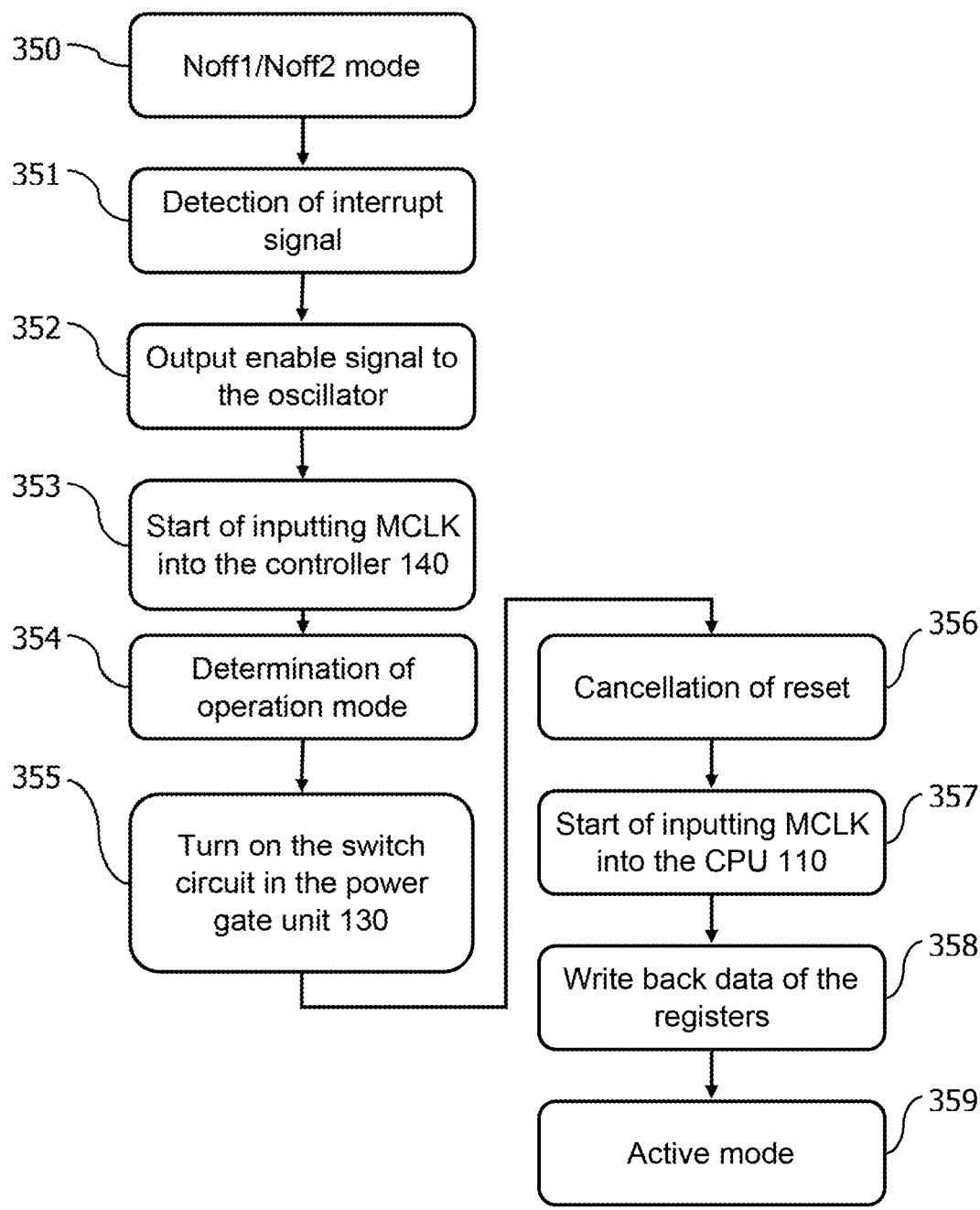
FIG. 5 is a flow chart of an example of a shift from Noff1/Noff2 modes to Active mode.

FIG. 5 is a flow chart showing a return process from Noff1 or Noff2 mode to Active mode. Here, a case where the operation mode is returned from Noff1 mode to Active mode is described and the same can be applied to Noff2 mode too.

In Noff1 or Noff2 mode, when the controller 120 detects an interrupt signal and the controller 120 outputs an enable signal to the oscillator of the clock generation circuit 115 to restart oscillation, so that MCLK is outputted from the clock generation circuit 115 to the controller 120 (Steps 350 to 353).

The controller 120 determines an operation mode to be shifted, depending on a value of Noff_MODE in the register 180 (Step 354). In Noff1 or Noff2 mode, data in Noff_MODE is reset to an initial value, and thus Active mode is selected.

The controller 120 controls the power gate unit 130 to turn on the switch circuit 132 (Step 355). Then, the controller 120 cancels reset of the units 102 to 104 for which power supply is started again (Step 356), and supply of MCLK to the CPU 110 is started again (Step 357). Then, control signals are outputted to the registers 185 and 186 and data backed up in the nonvolatile memories are written back into the volatile memories (Step 358). Through these steps, the microcontroller 100 returns to Active mode (Step 359).

As described above, in Noff1 mode, the controller 120 enables the microcontroller 100 to return to Active mode in response to the interrupt signal T0IRQ from the timer circuit 145. Accordingly, by the timer function of the timer circuit 145, the microcontroller 100 can operate intermittently. In other words, the interrupt signal T0IRQ is outputted at regular intervals, so that the operation mode can be returned from Noff1 mode to Active mode regularly. In Active mode, when the controller 120 judges that processing in the microcontroller 100 finishes, the controller 120 executes the above-described control processing to bring the microcontroller 100 into Noff1 mode.

The microcontroller 100 should be in Active mode so that the CPU 110 can operate and process signals inputted from the connection terminals 174 and 175, but the time needed for the arithmetic processing of the CPU 110 is extremely short. Accordingly, in accordance with this embodiment, the microcontroller 100 can operate in the low power consumption mode (Noff1 mode), except for the period in which an external signal is processed.

Therefore, the microcontroller 100 is very suitable for devices that operate by intermittent control, such as a sensing device and a monitoring device. For example, the microcontroller 100 is suitable for control devices of fire alarms, smoke detectors, management units of secondary batteries, and the like. In particular, devices having batteries as power sources have a problem of power consumption due to long time operation. However, because in most part of the operation period of the microcontroller 100, only circuits needed for allowing the microcontroller 100 to return to Active mode operate, the power consumption during operation can be lowered.

Accordingly, in accordance with this embodiment, it is possible to provide the microcontroller that can operate with low power consumption by employing the low power consumption mode and can return to the normal operation mode rapidly from the low power consumption mode.

Further, necessary data can be backed up in nonvolatile memories of registers before power supply is stopped and thus, processing for power supply stop can be started before the finish of CPU processing, which leads to an increase of flexibility in timing for power supply stop.

This embodiment can be combined with another embodiment as appropriate.

Embodiment 2

A register including both a nonvolatile memory and a volatile memory will be described with reference to FIG. 6.

Figure 6:
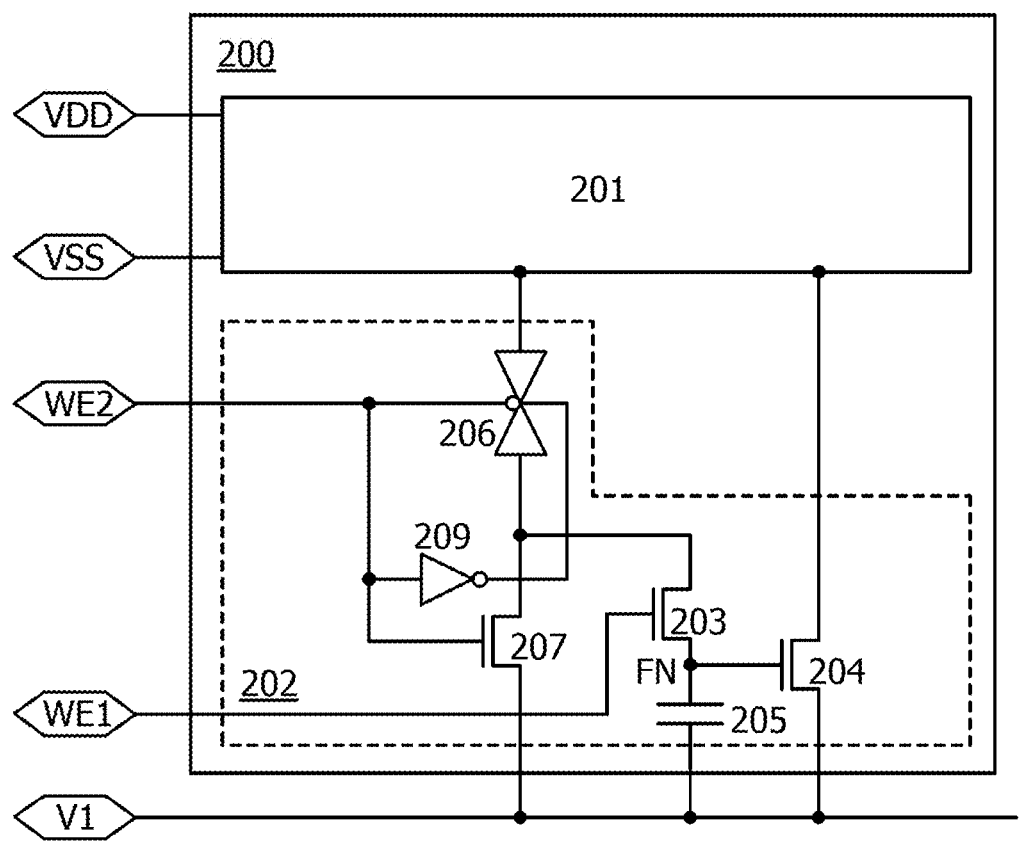
FIG. 6 is a circuit diagram illustrating an example of a register configuration.

FIG. 6 is a circuit diagram of a register including both a nonvolatile memory and a volatile memory. FIG. 6 illustrates a register 200 having a one-bit memory capacity. The register 200 includes memory circuits 201 and 202. The memory circuit 201 is a one-bit volatile memory, while the memory circuit 202 is a one-bit nonvolatile memory. Note that the register 200 can include another component such as a diode, a resistor, or an inductor.

To the memory circuit 201 is given a low power supply potential VSS (hereinafter, referred to as VSS) and a high power supply potential VDD (hereinafter, referred to as VDD) as power supply potentials. The memory circuit 201 can store data during a period in which a potential difference between VDD and VSS is supplied as a power supply potential.

The memory circuit 202 includes a transistor 203, a transistor 204, a capacitor 205, a transmission gate 206, a transistor 207, and an inverter 209.

A potential based on data of the memory circuit 201 is inputted into the memory circuit 202 through the transmission gate 206. The transistor 203 controls supply of the potential to a node FN. Further, the transistor 203 controls supply of a potential V1 to the node FN. In FIG. 6, ON/OFF of the transistor 203 is controlled by a signal WE1. Note that the potential V1 may be equal to VSS or VDD.

The node FN is a data storage portion in the memory circuit 202. The potential of the node FN is stored by the transistor 203 and the capacitor 205. Based on the potential of the node FN, ON/OFF of the transistor 204 is controlled. When the transistor 204 is turned on, the potential V1 is supplied to the memory circuit 201 through the transistor 204.

In response to a signal WE2, ON/OFF of the transmission gate 206 is controlled. To the transmission gate 206 are inputted a signal having an inverted polarity of the signal WE2 and a signal having the same polarity as the signal WE2. Here, the transmission gate 206 is turned off when the potential of the signal WE2 is at a high level and is turned on when it is at a low level.

In response to the signal WE2, ON/OFF of the transistor 207 is controlled. Here, the transistor 207 is turned on when the potential of the signal WE2 is at a high level, and the transistor 207 is turned off when the signal WE2 is at a low level. Note that instead of the transistor 207, another switch, such as a transmission gate, having a form different from the transistor 207 can be used.

In order to enhance the charge retention characteristics of the memory circuit 202, an off-state current of the transistor 203 is preferably as small as possible. This is because when an off-state current of the transistor 203 is small, the amount of charge leaked from the node FN can be reduced. As a transistor which allows leakage current to be lower than a transistor formed of single crystal silicon, a transistor formed using a thin film of oxide semiconductor which has a bandgap wider than silicon and an intrinsic carrier density lower than silicon is given.

Among oxide semiconductors, in particular, a highly purified oxide semiconductor (purified OS) obtained by reduction of impurities such as moisture or hydrogen serving as an electron donor (donor) and by reduction of oxygen vacancies is an intrinsic (i-type) semiconductor or a substantially i-type semiconductor. For this reason, a transistor having a channel formation region in a highly purified oxide semiconductor layer has an extremely small amount of off-state current and high reliability, and thus is suitable for the transistor 203.

Next, an example of operation of the register 200 will be described.

For the shift from Active mode to the low power consumption mode, data is backed up in the memory circuit 202 from the memory circuit 201. In order to reset the memory circuit 202 before backup of data, the transmission gate 206 is turned off, the transistor 207 is turned on, and the transistor 203 is turned on, so that the potential V1 is supplied to the node FN. In this manner, the potential of the node FN is set to an initial state.

Then, data is backed up from the memory circuit 201 into memory circuit 202. By turning on the transmission gate 206, turning off the transistor 207, and turning on the transistor 203, a potential reflecting the amount of charge stored in the memory circuit 201 is given to the node FN. In other words, data of the memory circuit 201 is written into the memory circuit 202. After writing data, the transistor 203 is turned off so that the potential of the node FN is stored. In this manner, data of the memory circuit 201 is stored in the memory circuit 202.

Then, power supply to the register 200 is stopped. In order to stop the power supply, VSS is given to a node to which VDD is given, by the power gate unit 130. Because the transistor 203 has extremely low off-state current, even when no VDD is supplied to the register 200, charge stored in the capacitor 205 or the gate capacitor of the transistor 204 can be stored for a long period. Thus, the memory circuit 202 can store data even during a period in which power supply is stopped.

For the return from the low power consumption mode to Active mode, supply VDD to the register 200 is restarted. Then, the memory circuit 201 is reset to an initial state. This step is made by giving VSS to the node storing the charge of the memory circuit 201.

Then, data stored in the memory circuit 202 is written into the memory circuit 201. When the transistor 204 is turned on, the potential V1 is given to the memory circuit 201. Since the memory circuit 201 receives the potential V1, a potential VDD is given to the node storing data. When the transistor 204 is turned off, the potential of the node storing data in the memory circuit 201 remains initial. Through the operation, data of the memory circuit 202 is stored in the memory circuit 201.

By using the register 200 for the registers to which power is not supplied, in the microcontroller 100 in a low power consumption mode, data can be backed up in a short period during processing by the microcontroller 100. Further, after power supply is restarted, the operation mode can be returned to a state before power supply stop in a short period. Thus, in the microcontroller 100, the power supply can be stopped even for a period as long as 60 seconds or as short as several milliseconds. As a result, the microcontroller 100 that consumes less power can be provided.

In the register 200, in accordance with the potential stored in the node FN in the memory circuit 202, the operation state (ON or OFF) of the transistor 204 is selected, so that data of 0 or 1 is read out based on the selected operation mode. Thus, the original data can be accurately read even when the amount of charge stored in the node FN fluctuates to some degree during the power supply stop.

In addition, VDD or VSS is supplied to the node FN in the memory circuit 202, based on the amount of charge stored in the memory circuit 201. In a case where the potential of the node FN when the gate voltage of the transistor 204 is equal to a threshold voltage is set as a potential V0, the potential V0 is a value between VDD and VSS and the operation mode of the transistor 204 is switched when the node FN takes the potential V0. However, the potential V0 is not necessarily equal to a medial between VDD and VSS. For example, if a potential difference between VDD and the potential V0 is larger than a potential difference between VSS and the potential V0, it takes longer for the node FN to reach the potential V0 by giving VSS to the node FN storing VDD than by giving VDD to the node FN storing VSS. For this reason, switching of the transistor 204 is performed slowly.

However, in the register 200, before data of the memory circuit 201 is written into the memory circuit 202, the potential V1 is given to the node FN, so that the potential of the node FN can be set into an initial state. In this manner, even when the potential V0 is smaller than the median between VDD and VSS, the potential V1 equal to the potential VSS is given in advance to the node FN, thereby shortening the time required for giving the potential VSS to the node FN. As a result, data can be written into the memory circuit 202 rapidly.

In addition, the register 200 including the transistor 203 with extremely low off-state current can reduce power consumption (overhead) resulting from operations such as data backup and data recovery, as compared with nonvolatile memories such as an MRAM. As a comparative example, a magnetoresistive random access memory (MRAM) is given. A general MRAM needs 50 µA to 500 µA as a current for writing data. On the other hand, the current of the register 200 for writing data can be about 1/100 of that of such an MRAM because in the register 200, data is backed up by supply of charge to a capacitor. Accordingly, in the register 200, a period of power supply stop, in which overhead and power reduced by power supply stop are equal, that is break even time (BET) can be shorter than the case where an MRAM is used for a register. In other words, power consumed when data is backed up in the register at the time of shifting the operation mode can be reduced by applying the register 200 to the registers of the microcontroller 100.

This embodiment can be combined with another embodiment as appropriate.

Embodiment 3

Figure 7:
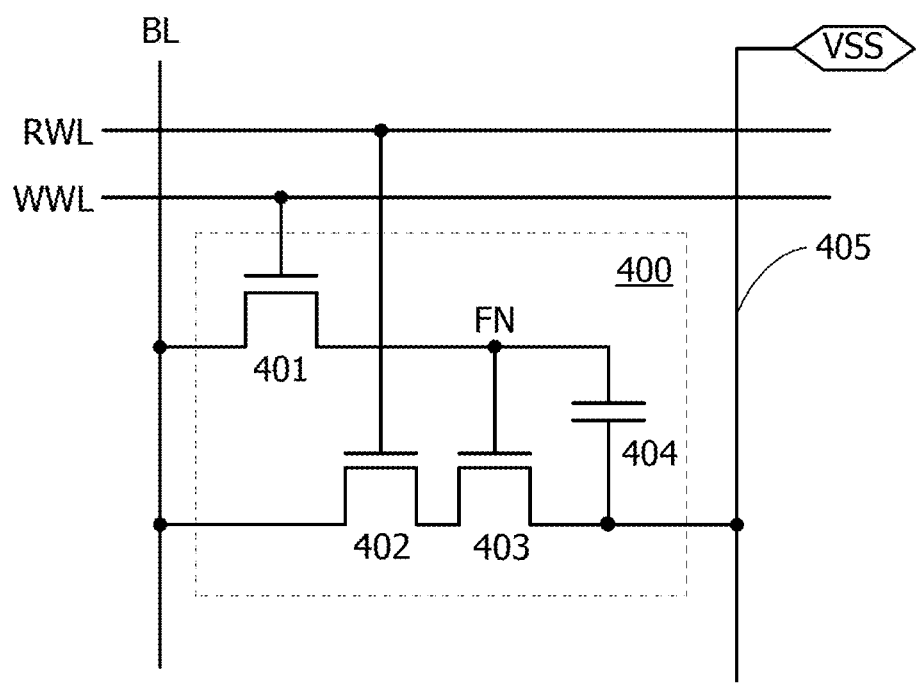
FIG. 7 is a circuit diagram illustrating an example of a RAM memory cell configuration.

A memory cell structure of the RAM 112 will be described with reference to FIG. 7. FIG. 7 is a circuit diagram of a memory cell 400 in the RAM 112. The memory cell 400 includes three transistors 401 to 403 and a capacitor 404. The memory cell 400 is connected to a bit line BL, a word line RWL, and a word line WWL. The word line RWL is a read word line, and the word line WWL is a write word line. In addition, VSS is supplied from a power supply line 405 to the memory cell 400. When VSS is a potential higher than 0 V, the potential of the power supply line 405 can be 0 V.

The bit line BL is connected to a read-out circuit and a write circuit of the RAM 112. In addition, the word lines RWL and WWL are connected to a row driver.

In order that the memory cell 400 can act as a nonvolatile memory circuit, the transistor 401 is preferably a transistor with extremely low off-state current, like the transistor 203 in the register 200. This is because the charge of the node FN (the gate of the transistor 403) is stored as data in the memory cell 400.

Operations of readout and write are described below. In order that data can be written in the memory cell 400, the potential of the word line RWL is set at a low level and the potential of the word line WWL is set at a high level, so that the transistor 401 alone is turned on. The charge corresponding to the potential of the bit line BL is accumulated in the node FN. After the potential of the word line WWL is kept at a high level for a certain period, the potential is set back to a low level, whereby the write operation is finished.

To perform readout operation, the potential of the bit line BL is set at a high level (precharge). Then, the potential of the word line WWL is set at a low level and the potential of the word line RWL is set at a high level, so that the transistor 402 is turned on. Between a source and a drain of the transistor 403, a current corresponding to the potential of the gate (node FN) flows. Depending on the amount of the current flowing, the potential of the bit line BL is decreased. The readout circuit detects a shift amount of the potential of the bit line BL and judges whether data stored in the memory cell 400 is 0 or 1.

The memory cell 400 in this embodiment controls ON/OFF of only one transistor for both the readout operation and the write operation, and thus, a rapidly-operable RAM, which is nonvolatile, can be provided.

This embodiment can be combined with another embodiment as appropriate.

Embodiment 4

Figure 8:
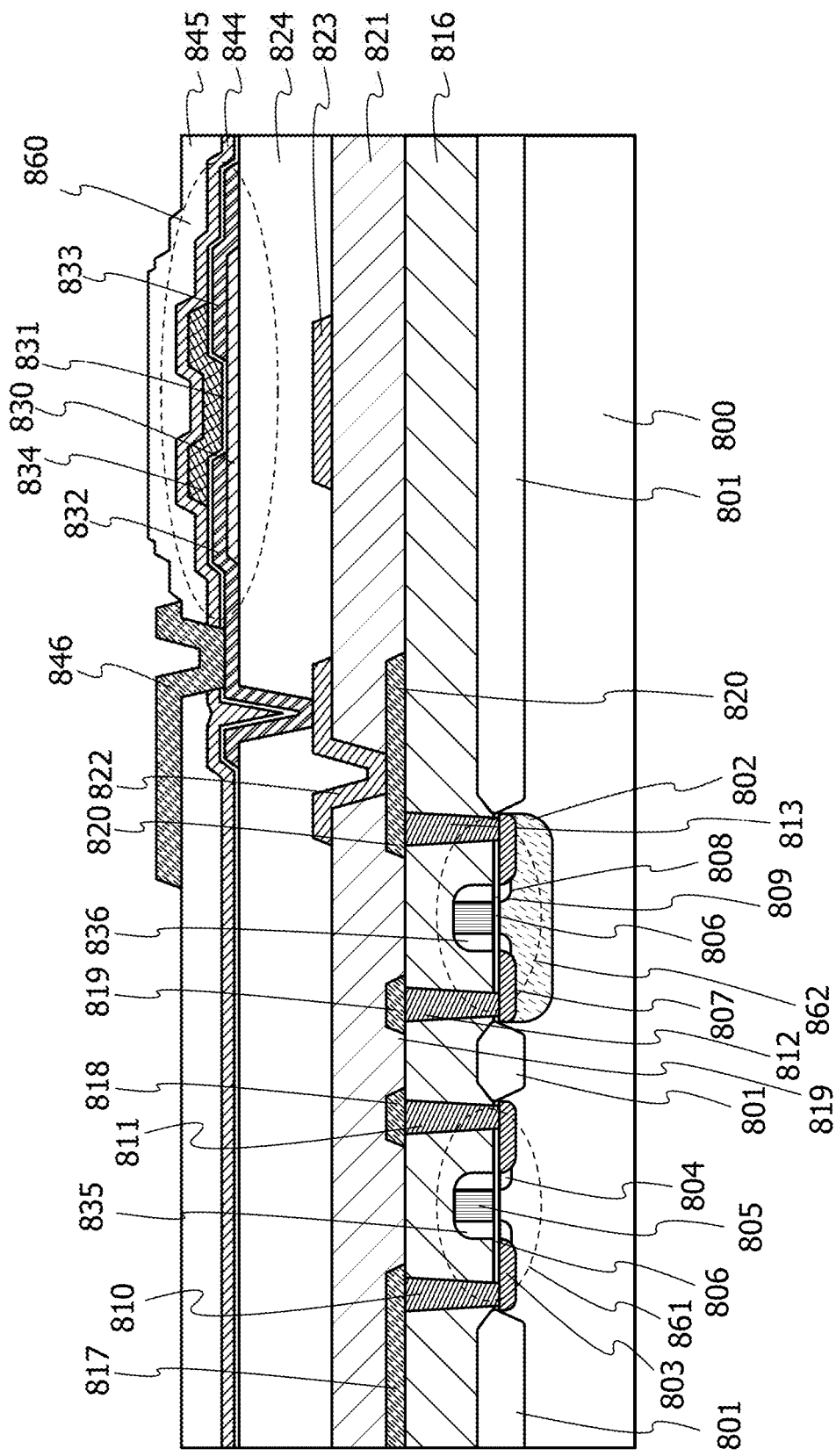
FIG. 8 is a cross-sectional view illustrating an example of a microcontroller structure.

Each circuit in the microcontroller 100 can be formed on the same semiconductor substrate. FIG. 8 illustrates an example of a cross-sectional structure of a part of the microcontroller 100. In FIG. 8, as main components making up of circuits in the microcontroller 100, a transistor 860 having a channel formation region in an oxide semiconductor layer and a p-channel transistor 861 and an n-channel transistor 862 each having a channel formation region in a silicon substrate are illustrated.

The transistor 860 is applied to the memory cell of the RAM 112 (the transistor 401 in FIG. 7), and the registers 185 to 187 (see the transistor 203 in FIG. 6). The transistors 861 and 862 can be applied to other transistors.

As illustrated in FIG. 8, the transistor 861 and the transistor 862 are formed on a semiconductor substrate 800. The semiconductor substrate 800 can be, for example, a single crystal silicon substrate having n-type or p-type conductivity, a compound semiconductor substrate (e.g., a GaAs substrate, an InP substrate, a GaN substrate, a SiC substrate, or a ZnSe substrate), or the like. In FIG. 8, a case where a single crystal silicon substrate having n-type conductivity is used is illustrated as an example.

In addition, the transistors 861 and 862 are electrically isolated from each other by an element isolation insulating film 801. The element isolation insulating film 801 can be formed by a selective oxidation method such as a local oxidation of silicon (LOCOS) method, a trench isolation method, or the like. The semiconductor substrate 800 may be an SOI type semiconductor substrate. In this case, element isolation can be conducted by dividing a semiconductor layer into elements by etching.

In a region where the transistor 862 will be formed, a p-well 802 is formed by selective addition of an impurity element imparting p-type conductivity.

The transistor 861 includes an impurity region 803, a low concentration impurity region 804, a gate electrode 805, and a gate insulating film 806 formed between the gate electrode 805 and the semiconductor substrate 800. The gate electrode 805 includes a sidewall 836 in its periphery.

The transistor 862 includes an impurity region 807, a low concentration impurity region 808, a gate electrode 809, and the gate insulating film 806. The gate electrode 809 includes a sidewall 835 in its periphery.

An insulating film 816 is formed over the transistors 861 and 862. Opening portions are formed in the insulating film 816, and a wiring 810 and a wiring 811 are formed to be in contact with the impurity regions 803, and a wiring 812 and a wiring 813 are formed to be in contact with the impurity regions 807.

The wiring 810 is connected to a wiring 817 formed over the insulating film 816, the wiring 811 is connected to a wiring 818 formed over the insulating film 816, the wiring 812 is connected to a wiring 819 formed over the insulating film 816, and the wiring 813 is connected to a wiring 820 formed over the insulating film 816.

An insulating film 821 is formed over the wirings 817 to 820. An opening portion is formed in the insulating film 821, a wiring 822 and a wiring 823 connected to the wiring 820 in the opening portion are formed over the insulating film 821. In addition, an insulating film 824 is formed over the wiring 822 and the wiring 823.

A transistor 860 having an oxide semiconductor layer 830 is formed over the insulating film 824. The transistor 860 includes a conductive film 832 and a conductive film 833 each of which serves as a source electrode or a drain electrode, a gate insulating film 831, and a gate electrode 834 over the oxide semiconductor layer 830. The conductive film 832 is connected to the wiring 822 in the opening portion formed in the insulating film 824.

The wiring 823 is overlapped with the oxide semiconductor layer 830 with the insulating film 824 interposed therebetween. The wiring 823 acts as a backgate of the transistor 860. The wiring 823 can be formed as needed.

The transistor 860 is covered with an insulating film 844 and an insulating film 845. The insulating film 844 is preferably an insulating film that can prevent hydrogen released from the insulating film 845 from entering the oxide semiconductor layer 830. Examples of such an insulating film are a silicon nitride film and the like.

A conductive film 846 is formed over the insulating film 844. The conductive film 846 is in contact with the conductive film 832 in an opening portion formed in the insulating film 844, the insulating film 845, and the gate insulating film 831.

The thickness of the oxide semiconductor layer 830 is preferably from 2 nm to 40 nm. The oxide semiconductor layer 830 is preferably an i-type (intrinsic) or substantially intrinsic oxide semiconductor so as to form a channel formation region of the transistor 860. Note that an oxide semiconductor layer which is highly purified by reduction of impurities serving as electron donors (donors), such as moisture and hydrogen, and which includes reduced oxygen vacancies is an intrinsic (i-type) semiconductor or a substantially i-type semiconductor. Here, such an oxide semiconductor layer is referred to as a highly-purified oxide semiconductor layer. A transistor formed using a highly-purified oxide semiconductor layer has an extremely small amount of off-state current and high reliability.

The carrier density of the oxide semiconductor layer 830 is preferably $1\times10^{17}/cm^3$ or lower, more preferably $1\times10^{16}/cm^3$ or lower, $1\times10^{15}/cm^3$ or lower, $1\times10^{14}/cm^3$ or lower, or $1\times10^{13}/cm^3$ or lower, for forming a transistor with low off-state current.

The source-drain current of the transistor 860 in an off state can be $1\times10^{-18}$ A or lower at room temperature (about 25° C.) as the result of using the oxide semiconductor layer 830. The off-state source-drain current at room temperature (about 25° C.) is preferably $1\times10^{-21}$ A or lower, more preferably $1\times10^{-24}$ A or lower. Alternatively, at 85° C., the current value can be $1\times10^{-15}$ A or lower, preferably, $1\times10^{-18}$ A or lower, more preferably $1\times10^{-21}$ A or lower. An off state of a transistor refers to a state where a gate voltage is much lower than a threshold voltage in an n-channel transistor. Specifically, the transistor is in an off state when the gate voltage is lower than the threshold voltage by 1 V or more, 2 V or more, or 3 V or more.

Some experiments prove that the off-state current of the transistor using an oxide semiconductor layer is extremely low. For example, the following measurement data was obtained: a transistor with a channel width of $1\times10^6$ μm and a channel length of 10 μm can have an off-state current less than or equal to the measurement limit of a semiconductor parameter analyzer, that is, less than or equal to $1\times10^{-13}$ A when the voltage (drain voltage) between a source and a drain ranges between 1 V and 10 V. In that case, it can be seen that off-state current standardized on the channel width of the transistor is 100 zA/μm or lower.

In another experiment, off-state current is measured with a circuit in which a capacitor and a transistor are connected to each other and charge flowing to or from the capacitor is controlled by the transistor. In this case, the off-state current is measured from a change in the amount of charge of the capacitor per unit time. As a result, it is found that when the drain voltage is 3 V, an off-state current of several tens of yoctoamperes per micrometer (yA/μm) can be achieved. Accordingly, the off-state current of the transistor in which the purified oxide semiconductor film is used as a channel formation region is considerably lower than that of a transistor formed using silicon having crystallinity.

The oxide semiconductor layer 830 preferably contains at least indium (In) or zinc (Zn). Examples of oxide semiconductors are indium oxide, zinc oxide, In—Zn based oxide, In—Ga—Zn based oxide, In—Al—Zn based oxide, In—Sn—Zn based oxide, and the like.

Further, typical crystal structures of the oxide semiconductor layer 830 are single crystal, polycrystal, and amorphous. As the oxide semiconductor layer 830, a CAAC-OS (c-axis aligned crystalline oxide semiconductor) film is preferred.

An oxide semiconductor film used for the oxide semiconductor layer 830 is described below.

An oxide semiconductor film may be a single-crystal oxide semiconductor film or a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films having a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In observation with a transmission electron microscope (TEM) image of the CAAC-OS film, a boundary between crystal parts, that is, a clear grain boundary is not seen. Thus, in the CAAC-OS film, a reduction in electron mobility resulting from the grain boundary is less likely to occur.

In this specification, a term "parallel" indicates that the angle formed between two straight lines is from −10° to 10°, and accordingly, also includes a case where the angle is from −5° to 5°. In addition, a term "perpendicular" indicates that the angle formed between two straight lines is from 80° to 100°, and accordingly includes a case where the angle is from 85° to 95°.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to a TEM image of the CAAC-OS film observed in a direction substantially perpendicular to the sample surface (plan TEM image), metal atoms are arranged in a triangular or hexagonal configuration in the crystal parts. However, no regularity of arrangement of metal atoms is observed between different crystal parts.

From the results of the cross-sectional TEM image and the plan TEM image, alignment is found in the crystal parts in the CAAC-OS film.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters the sample in a direction perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of the CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in the layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, if a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, when crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added may be changed, and the degree of crystallinity in the CAAC-OS film may vary depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° is derived from the (311) plane of a ZnGa$_2$O$_4$ crystal; such a peak indicates that a ZnGa$_2$O$_4$ crystal is included in part of the CAAC-OS film including the InGaZnO$_4$ crystal. It is preferable for the CAAC-OS film that a peak of 2θ appears at around 31° and a peak of 2θ does not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

A formation method of the CAAC-OS film is described below. A CAAC-OS film is formed by, for example, a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining its crystal state, whereby the CAAC-OS film can be formed.

As for the flat-plate-like sputtered particle, for example, the circle diameter equivalent of a plane that is parallel to an a-b plane is from 3 nm to 10 nm and the thickness (length in the direction perpendicular to the a-b plane) is 0.7 nm or more and less than 1 nm. Note that in the flat-plate-like sputtered particle, the plane parallel to the a-b plane may be a regular triangle or a regular hexagon. Here, the term "circle diameter equivalent of a plane" refers to the diameter of a perfect circle having the same area as the plane.

For the deposition of the CAAC-OS film, the following conditions are preferably used.

By increasing the substrate heating temperature during the deposition, migration of a sputtered particle is likely to occur after the sputtered particle reaches a substrate surface. Specifically, the substrate heating temperature during the deposition is from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particles is attached to the substrate. At this time, the sputtered particles are positively charged, whereby the sputtered particles repelling each other are attached to the substrate. Therefore, the sputtered particles are not gathered and are not overlapped unevenly with each other, so that the CAAC-OS film having a uniform thickness can be formed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is from 100° C. to 740° C., preferably from 200° C. to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under such a reduced atmosphere can reduce the concentration of impurities in the CAAC-OS film for a shorter time.

As an example of the sputtering target, an In—Ga—Zn oxide target is described below.

The In—Ga—Zn oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed thereto at a temperature from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 1:3:2, 1:6:4, 4:2:3, or 3:1:2. The kinds of powder and the molar ratio for mixing powder may be determined as appropriate depending on a desired sputtering target.

Alternatively, the CAAC-OS film can be formed by plural times of deposition of films. An example of such a method is described below.

First, a first oxide semiconductor layer is formed to a thickness of 1 nm or more and less than 10 nm. The first oxide semiconductor layer is formed by a sputtering method. Specifically, at this time, the substrate heating temperature is from 100° C. to 500° C., preferably, from 150° C. to 450° C., and the oxygen ratio in a deposition gas is 30 vol % or more, preferably 100 vol %.

Then, heat treatment is performed to increase the crystallinity of the first oxide semiconductor layer to give the first CAAC-OS film with high crystallinity. The temperature of the heat treatment is from 350° C. to 740° C., preferably 450° C. to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor layer for a short time. At the same time, the heat treatment in an inert atmosphere may generate oxygen vacancies in the first oxide semiconductor layer. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the first oxide semiconductor layer for a shorter time.

Because the first oxide semiconductor layer has a thickness of 1 nm or more and less than 10 nm, the first oxide semiconductor layer can be more easily crystallized than that having a thickness of 10 nm or more.

Then, a second oxide semiconductor layer having the same composition as the first oxide semiconductor layer is formed to a thickness of from 10 nm to 50 nm. The second oxide semiconductor layer is formed by a sputtering method. Specifically, at this time, the substrate heating temperature is from 100° C. to 500° C., preferably, from 150° C. to 450° C., and the oxygen ratio in a deposition gas is 30 vol % or more, preferably 100 vol %.

Then, heat treatment is conducted so that the second oxide semiconductor layer is turned into a second CAAC-OS film with high crystallinity by solid phase growth from the first CAAC-OS film. The temperature of the heat treatment is from 350° C. to 740° C., preferably from 450° C. to 650° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor layer for a short time. At the same time, the heat treatment in an inert atmosphere may generate oxygen vacancies in the second oxide semiconductor layer. In this case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under a reduced pressure can reduce the concentration of impurities in the second oxide semiconductor layer for a shorter time.

This embodiment can be combined with another embodiment as appropriate.

Embodiment 5

In this embodiment, another configuration of a microcontroller will be described.

Figure 9:
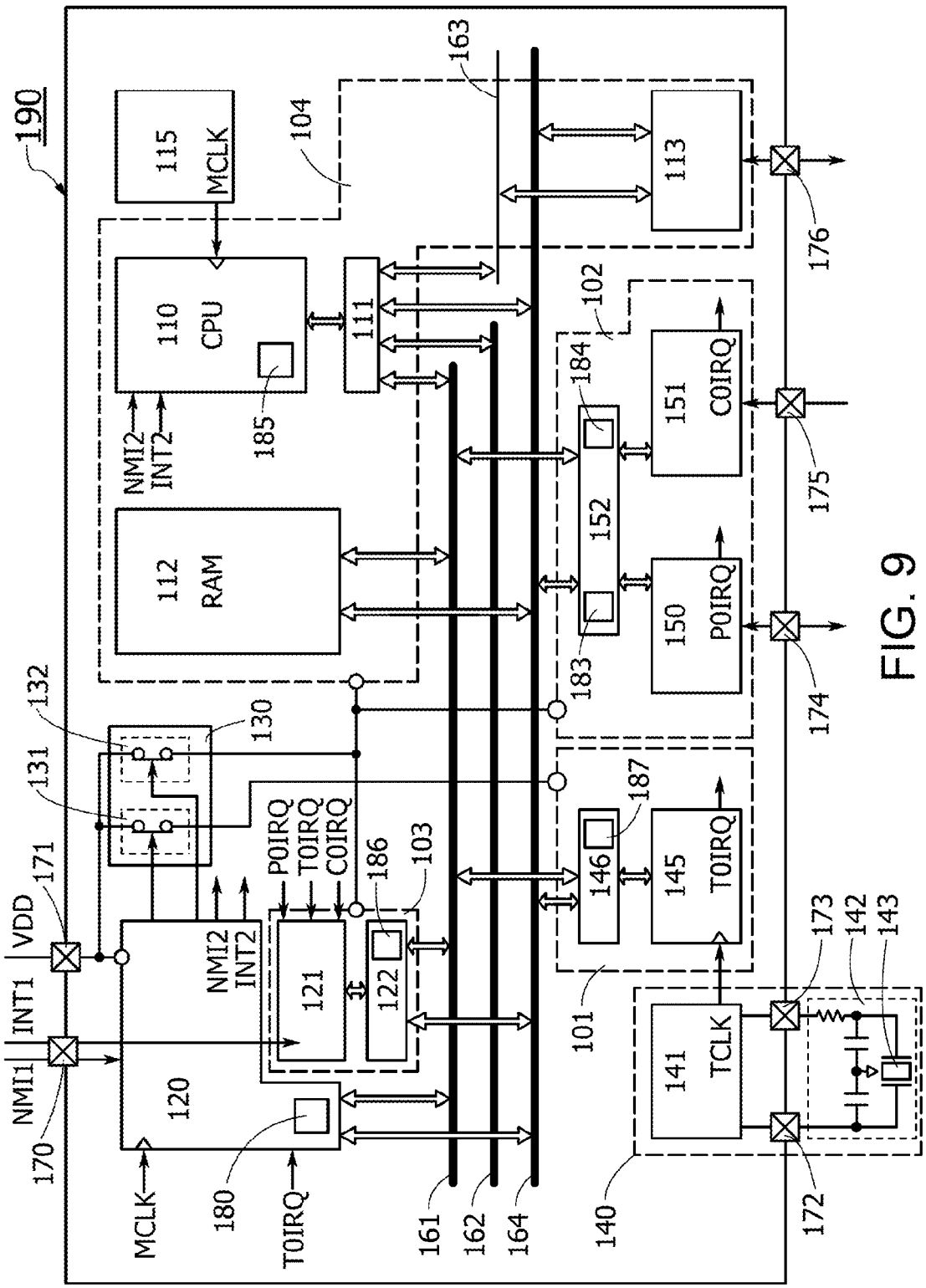
FIG. 9 is a block diagram illustrating an example of a microprocessor configuration.

FIG. 9 is a block diagram of a microcontroller 190.

Like the microcontroller 100 in FIG. 1, the microcontroller 190 includes the CPU 110, the bus bridge 111, the RAM 112, the memory interface 113, the controller 120, the interrupt controller 121, the I/O interface (input/output interface) 122, and the power gate unit 130.

The microcontroller 190 further includes the crystal oscillation circuit 141, the timer circuit 145, the I/O interface 146, the I/O port 150, the comparator 151, the I/O interface 152, the bus line 161, the bus line 162, the bus line 163, and the data bus line 164. The microcontroller 190 further includes at least the connection terminals 170 to 176 as connection parts with an external device. In addition, the microcontroller 190 is connected to the oscillator 142 having the quartz crystal unit 143 via the connection terminals 172 and 173.

Each block of the microcontroller 190 has a function similar to that of the microcontroller 100 in FIG. 1. Table 2 shows a function of each circuit in the microcontroller 100 and the microcontroller 190. Further, as in the microcontroller 100, the operation modes of the microcontroller 190 are also switched based on the flow charts of FIG. 3 to FIG. 5.

TABLE 2

| Circuit block | Function |
|---|---|
| CPU 110 | Executing instruction |
| Clock generation circuit 115 | Generating clock signal MCLK |
| Crystal oscillation circuit 141 | Generating clock signal TCLK |
| Controller 120 | Controlling the whole microcontroller 100 |
| Interrupt controller 121 | Setting priorities to interrupt requests |
| I/O interface 146 | Inputting/outputting data |
| I/O interface 152 | Inputting/outputting data |
| I/O port 150 | Interface for connecting with external device |
| Timer circuit 145 | Generating interrupt signal for timer operation |
| Comparator151 | Comparing potentials (current) of input signal and reference signal |
| RAM 112 | Memory serving as main memory of CPU 110 |
| Memory interface 113 | Input/output interface with external memory |

The microcontroller 190 is different from the microcontroller 100 in signals for interrupt request. The difference is described below.

An external interrupt signal INT1 and an external interrupt signal NMI1 are inputted into the connection terminal 170 that serves as an input terminal of an external interrupt signal. The external interrupt signal NMI1 is a non-maskable interrupt signal.

The external interrupt signal NMI1 inputted via the connection terminal 170 is inputted into the controller 120. When the external interrupt signal NMI1 is inputted into the controller 120, the controller 120 immediately outputs an internal interrupt signal NMI2 to the CPU 110, so that the CPU 110 executes interrupt processing.

The external interrupt signal INT1 is inputted into the interrupt controller 121 via the connection terminal 170. Interrupt signals (T0IRQ, P0IRQ, and C0IRQ) are inputted into the interrupt controller 121 from the peripheral circuits (145, 150, and 151) without going through the buses (161 to 164).

When the controller 120 receives the external interrupt signal INT1, the controller 120 outputs the internal interrupt signal INT2 to the CPU 110, so that the CPU 110 executes interrupt processing.

Further, there is a case where the interrupt signal T0IRQ is directly inputted into the controller 120 without going through the interrupt controller 121. When the controller 120 receives the interrupt signal T0IRQ, the controller 120 outputs the internal interrupt signal NMI2 to the CPU 110, so that the CPU 110 executes interrupt processing.

As in the microcontroller 100, the power gate unit 130 of the microcontroller 190 is controlled by the controller 120. As described above, the controller 120 outputs a signal to turn off one or both of the switch circuits included in the power gate unit 130, depending on the request by the CPU 110 (power supply stop). In addition, the controller 120 outputs a signal to turn on the switch circuit 132 included in the power gate unit 130 with, as a trigger, the external interrupt signal NMI1 or the interrupt signal T0IRQ from the timer circuit 145 (start of power supply).

Further, the microcontroller 190 includes the controller 120, the power gate unit 130, and the like, and thus, the microcontroller 190 also can operate in three operation modes (Active mode, Noff1 mode and Noff2 mode), like the microcontroller 100. In addition, the circuits that are active or non-active in each operation mode are the same as those of the microcontroller 100 (see Table 1). Further, the operation modes of the microcontroller 190 are switched by the controller 120, like the microcontroller 100. The controller 120 switches the operation modes based on the flow charts in FIG. 3 to FIG. 5.

In order that the microcontroller 190 can return rapidly from Noff1/Noff2 mode to Active mode, the registers 185 to 187 each have a volatile data storage portion and a nonvolatile data storage portion for saving data as backup during power supply stop. Further, in the microcontroller 190, the register 184 in the comparator 151 has a volatile data storage portion (memory) and a nonvolatile data storage portion (memory), like the registers 185 to 187.

In the microcontroller 100, the register 184 includes no nonvolatile memories, but the register 184 in the microcontroller 100 can have a nonvolatile memory, like the registers 185 to 187.

In the shift from Active mode to Noff1/Noff2 mode, prior to power supply stop, data stored in the volatile memories in the registers 184 to 187 are written into in the nonvolatile memories, and data stored in the volatile memories are reset to initial values. Then, power supply to the registers 184 to 187 is stopped.

In the return from Noff1/Noff2 mode to Active mode, power supply to the registers 184 to 187 is started again, and data in the volatile memories are reset to initial values. Then, the data stored in the nonvolatile memories are written into the volatile memory.

Accordingly, even in the low power consumption mode, data needed for processing of the microcontroller 190 are stored in the registers 184 to 187, and thus, the microcontroller 190 can return from the low power consumption mode to Active mode immediately.

Thus, in accordance with this embodiment, the microcontroller that can operate with low power consumption by employing the low power consumption mode and can return rapidly from the low power consumption mode to the normal operation mode can be provided.

Accordingly, the microcontroller 190 is also very suitable for devices that operate by intermittent control, such as a sensing device and a monitoring device. For example, the microcontrollers 100 and 190 are suitable for control devices of fire alarms, smoke detectors, management units of secondary batteries, and the like. In particular, devices having batteries as power sources have a problem of power consumption due to long time operation. However, like the microcontroller 100, because most part of the operation period of the microcontroller 190 is in Noff1 mode, only circuits needed for allowing the microcontroller 190 to return to Active mode operate, the power consumption during operation can be lowered.

Embodiment 6

In this embodiment, another example of a configuration of a microcontroller will be described.

Figure 13:
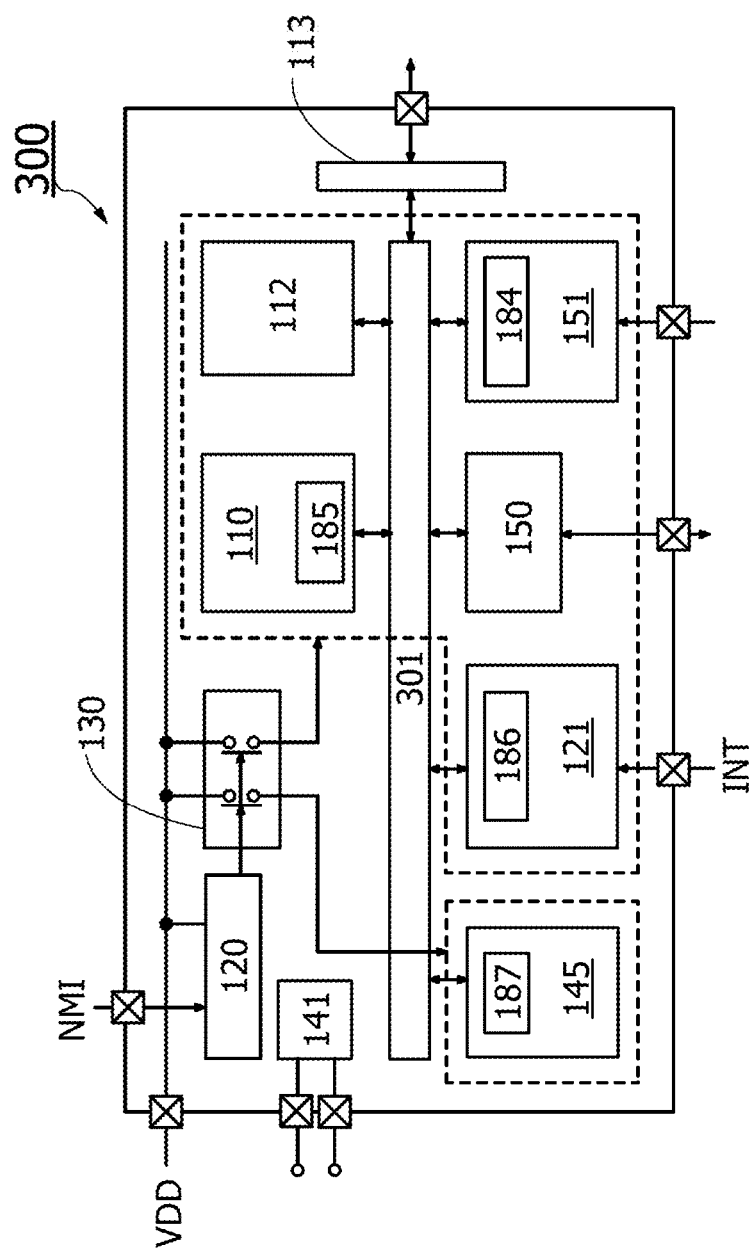
FIG. 13 is a block diagram illustrating an example of a microcontroller configuration.

FIG. 13 is a block diagram of a microcontroller 300.

Like the microcontroller 100 in FIG. 1, the microcontroller 300 includes the CPU 110, the RAM 112, the memory interface 113, the controller 120, the interrupt controller 121, and the power gate unit 130.

The microcontroller 300 further includes a bus bridge, a bus line, and a data bus line. In FIG. 13, the bus bridge, the bus line, and the data bus line of the microcontroller 300 are referred to as BUS 301.

In addition, in FIG. 13, an I/O interface connecting the interrupt controller 121 and BUS 301 is not illustrated, and the register 186 of the controller 120 is provided in the interrupt controller 121.

The microcontroller 300 further includes the crystal oscillation circuit 141, the timer circuit 145, the I/O port 150, and the comparator 151. In addition, although not illustrated in FIG. 13, the oscillator having the quartz crystal unit is connected to the crystal oscillation circuit 141 of the microcontroller 300 via a connection terminal.

In FIG. 13, an I/O interface connecting the timer circuit 145 and BUS 301 is not illustrated, and the register 187 is provided in the timer circuit 145.

In FIG. 13, an I/O interface connecting the comparator 151 and BUS 301 is not illustrated, and the register 184 is provided in the comparator 151.

Each block in the microcontroller 300 has a function similar to that in the microcontroller 100 in FIG. 1.

Further, the microcontroller 300 includes the controller 120, the power gate unit 130, and the like, and thus, the microcontroller 300 can operate in three operation modes (Active mode, Noff1 mode and Noff2 mode), like the microcontroller 100. In addition, the circuits that are active or non-active in each operation mode are the same as those of the microcontroller 100 (see Table 1). In addition, the operation modes of the microcontroller 300 are switched by the controller 120, like the microcontroller 100.

In order that the microcontroller 300 can return rapidly from Noff1/Noff2 mode to Active mode, the registers 185 to 187 each have a volatile data storage portion and a nonvolatile data storage portion for saving data as backup during power supply stop. Further, in the microcontroller 300, the register 184 in the comparator 151 has a volatile data storage portion and a nonvolatile data storage portion, like the registers 185 to 187.

In the shift from Active mode to Noff1/Noff2 mode, prior to power supply stop, data stored in the volatile memories in the registers 184 to 187 are written into the nonvolatile memories, and data stored in the volatile memories are reset to initial values. Then, power supply to the registers 184 to 187 is stopped.

In the return from Noff1/Noff2 mode to Active mode, power supply to the registers 184 to 187 is started again, and data in the volatile memories are reset to initial values. Then, the data stored in the nonvolatile memories written into the volatile memory.

Accordingly, even in the low power consumption mode, data needed for processing of the microcontroller 300 are stored in the registers 184 to 187, and thus, the microcontroller 300 can return from the low power consumption mode to Active mode immediately.

Thus, in accordance with this embodiment, the microcontroller that can operate with low power consumption by employing the low power consumption mode and can return rapidly from the low power consumption mode to the normal operation mode can be provided.

Accordingly, the microcontroller 300 is also very suitable for devices that operate by intermittent control, such as a sensing device and a monitoring device. For example, the microcontroller 300 is suitable for control devices of fire alarms, smoke detectors, management units of secondary batteries, and the like. In particular, devices having batteries as power sources have a problem of power consumption due to long time operation. However, because most part of the operation period of the microcontroller 300 is in Noff1 mode, only circuits needed for allowing the microcontroller 300 to return to Active mode operate, the power consumption during operation can be lowered, like the microcontroller 100.

Example 1

A microcontroller was fabricated practically and operation thereof was verified. The operation verification is described in this example.

Figure 10:
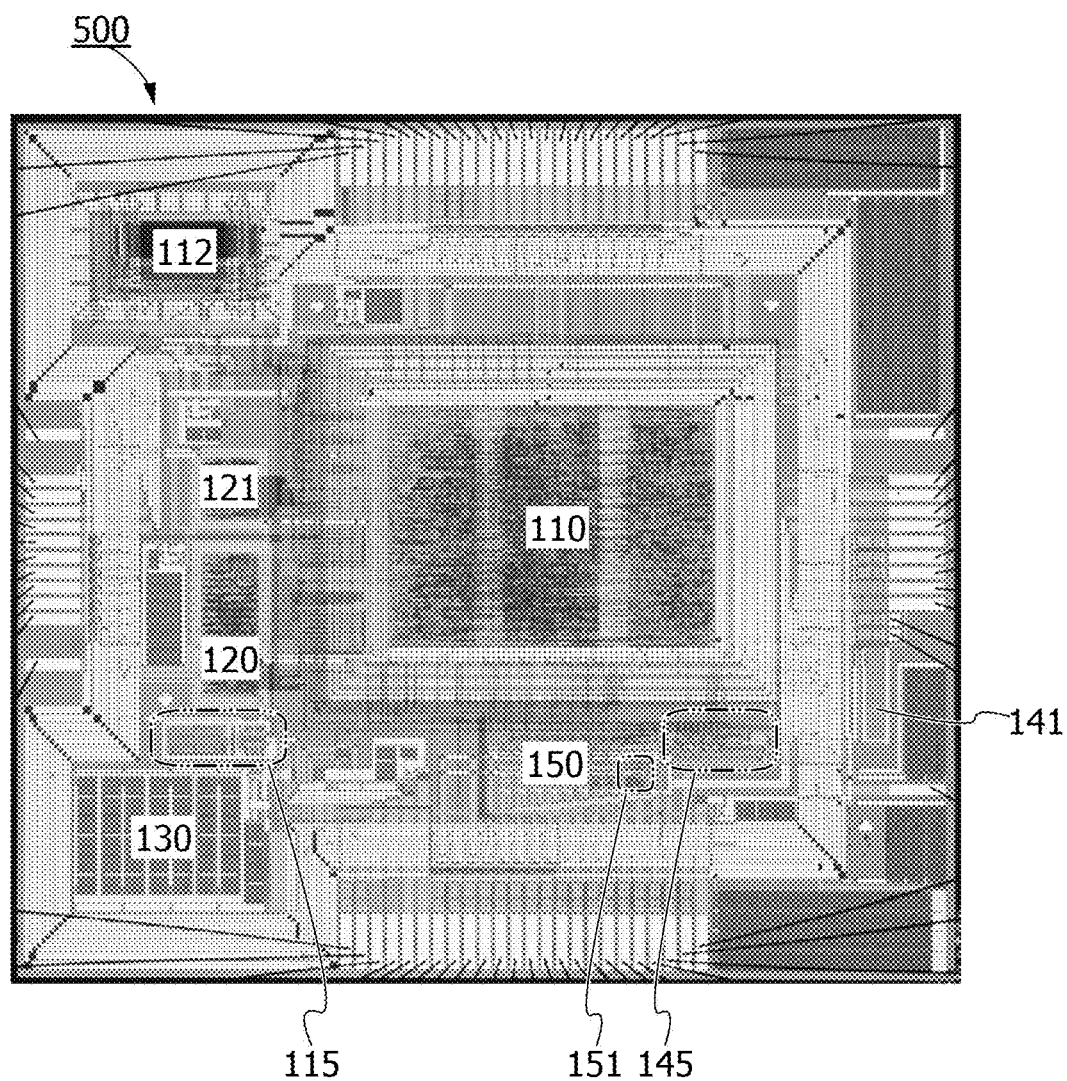
FIG. 10 is an optical micrograph of the microcontroller.

FIG. 10 is an optical micrograph of a microcontroller 500 that is fabricated using a silicon substrate. The microcontroller 500 has circuit blocks and functions similar to those of the microcontroller 190 illustrated in FIG. 9. Note that some of the reference numerals attached to the circuit blocks in FIG. 9 are used in FIG. 10.

The process technology of the microcontroller 500 in FIG. 10 is as follows: the 0.35 µm process technology is used for the transistor formed using silicon (Si-FET), and the 0.8 µm process technology is used for the transistor formed using an oxide semiconductor (CAAC-IGZO, c-axis-aligned-crystalline In—Ga—Zn-oxide) layer (the transistor is referred to as CAAC-IGZO-FET), like the microcontroller 100 in FIG. 2. The size of the microcontroller 500 is 11.0 mm×12.0 mm.

Table 3 shows the specifications of the microcontroller 500.

TABLE 3

| | Architecture | 8 bit CISC |
|---|---|---|
| Technology | Si-FET (W/L) [µm] | 8/0.35 |
| | CAAC-IGZO-FET (W/L) [µm] | 0.8/0.8 |
| Size | Die (W × H) [mm$^2$] | 11. × 12.0 |
| | CPU 110 (W × H) [mm$^2$] | 4.5 × 3.3 |
| Transistor count | CPU 110 | about 30,000 |
| | excluding CPU 110 | about 56,000 |
| Register 185 FF count | | 279 |
| Clock frequency [MHz] | | 8 |
| Power supply voltage [V] | | 20 |

It is confirmed that data is stored in the register 185 in the CPU 110, when the operation mode of the microcontroller 500 is shifted from Active mode to the Noff2 mode with no power supply. The result is described below with reference to signal waveform diagrams in FIG. 11 and FIGS. 12A and 12B.

To confirm if data is stored or not is performed as follows: data is stored in a HL register in the volatile memory of the register 185 in Active mode and the data stored in the HL register is read out after the operation mode returned to Active mode from Noff2 mode with no power supply.

Figure 11:
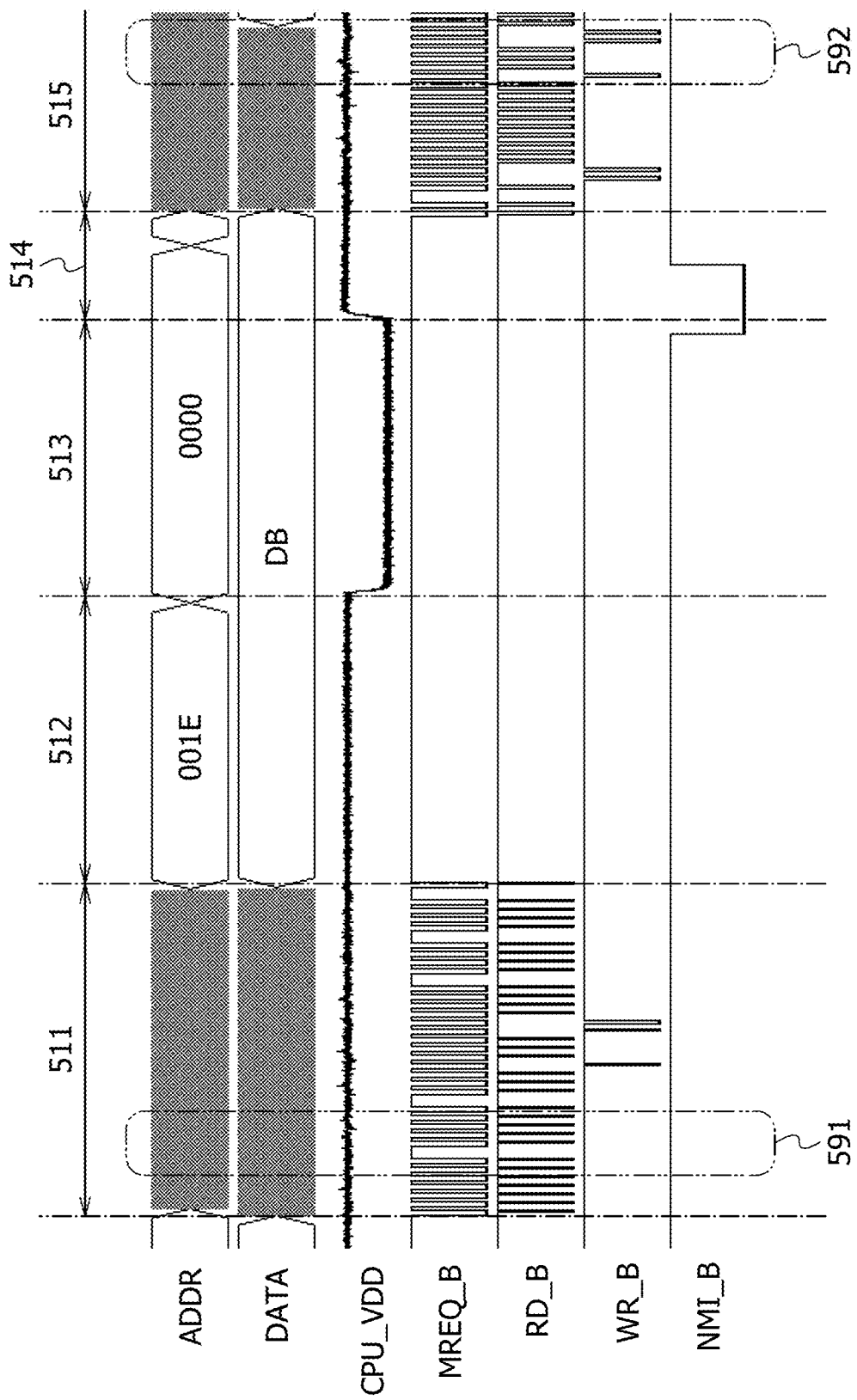
FIG. 11 is a signal waveform diagram of input-output terminals of the microcontroller, which is measured for operation verification of a register in a CPU.
Figure 12:
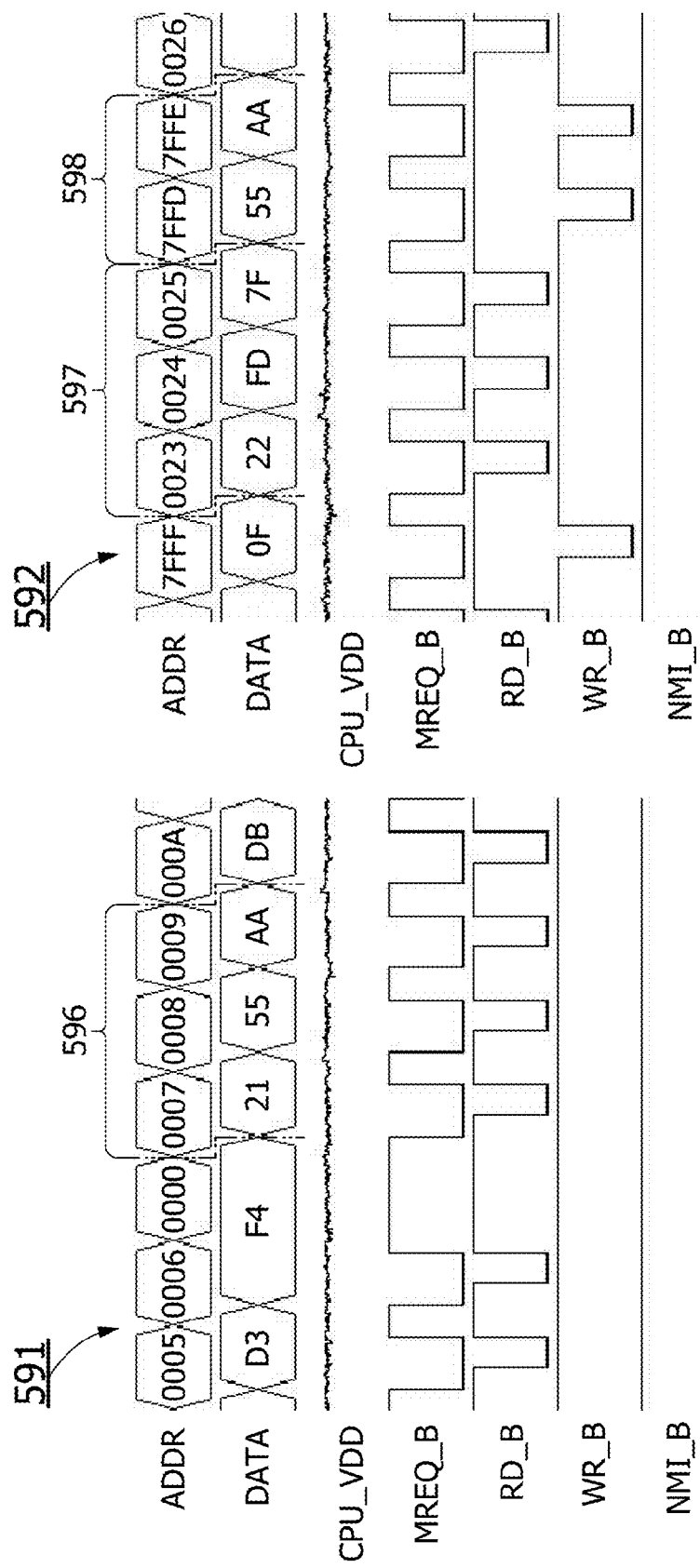
FIGS. 12A and 12B are enlarged views of the signal waveform diagram in FIG. 11, which are signal waveform diagrams during operation in Active mode.

FIG. 11, FIG. 12A, and FIG. 12B show results obtained by the following manner: a signal generated by a pattern generator module TLA7PG2 produced by Tektronix, Inc. is inputted into the microcontroller 500, and a signal generated at the input-output terminal (connection terminal) of the microcontroller 500 is measured by a logic analyzer TLA7AA2 produced by Tektronix, Inc.

"ADDR", "DATA", "CPU_VDD", "MREQ_B", "RD_B", "WR_B", and "NMI_B" shown in FIG. 11, FIG. 12A, and FIG. 12B are names of the input-output terminals measured by the logic analyzer.

From the ADDR terminal, the number of steps calculated by the CPU 110 (the value is changed sequentially depending on the number of processing) or an address accessed by the CPU 110 can be detected. In addition, from the DATA terminal, an instruction code executed by the CPU 110 in the microcontroller 500 or data inputted or outputted by the microcontroller 500 can be detected. In addition, from the CPU_VDD terminal, a potential of VDD supplied to the CPU 110 can be detected.

Further, from the MREQ_B terminal, a signal for determining access to an external memory can be detected. When the MREQ_B terminal has a low potential, access to the external memory is allowed, and when the MREQ_B terminal has a high potential, access to the external memory is denied. In addition, when the MREQ_B terminal has a low potential and the RD_B terminal has a low potential, readout of data from the external memory is allowed, and when the MREQ_B terminal has a low potential and the WR_B terminal has a low potential, writing of data to the external memory is allowed.

In addition, from the NMI_B terminal, a nonmaskable interrupt signal can be detected. Although a high potential is usually supplied to the NMI_B terminal, when a low potential is supplied to the NMI_B terminal, interrupt processing is executed.

Note that the "high potential" means a potential higher than a reference potential and the "low potential" means a potential lower than the reference potential. In the case where the reference potential is 0 V, the high potential can be called a positive potential and the low potential can be called a negative potential. Alternatively, one of the high potential and the low potential can be equal to the reference potential.

In addition, periods 511 and 515 illustrated in FIG. 11 are periods in which the microcontroller 500 operates in Active mode. A period 512 is a backup process period in which data is transferred from the volatile memory to the nonvolatile memory in each register, before the operation mode of the microcontroller 500 is shifted from Active mode to Noff2 mode. A period 513 is a period in which the microcontroller 500 operates in Noff2 mode. A period 514 is a return process period in which data is returned back to the volatile memory from the nonvolatile memory in each register, before the operation mode of the microcontroller 500 returns from Noff2 mode to Active mode.

FIG. 12A illustrates signals in a period 591 which are partly-enlarged signals of the signals measured in the period 511 in Active mode operation. In addition, FIG. 12B illustrates signals in a period 592 which are partly-enlarged signals of the signals measured in the period 515 in Active mode operation.

In the period 511 (Active mode period), data "AA55" is stored in the HL register that is a part of the register 185. This process is called as a process 596 (see FIG. 12A). In the process 596, "21" detected from the DATA terminal when the ADDR terminal is "0007" is an instruction code for storing data in the HL register. In addition, "55" and "AA" that are subsequently detected from the DATA terminal are data stored in the HL register. Note that the microcontroller 500 processed data in terms of bytes, and thus "55" is detected as the low byte first and then "AA" is detected as the high byte (see FIG. 11 and FIG. 12A).

Next, operation verification of the microcontroller 500 in the shift from Active mode to Noff2 mode illustrated in FIG. 4 is described.

For the operation verification, a signal for switching the operation mode to Noff2 mode is inputted into the microcontroller 500. When the signal for switching the operation mode to Noff2 mode is inputted into the microcontroller 500, the microcontroller 500 transfers data that is needed to be stored after power supply stop, of data stored in the volatile memories of the registers (184 to 187), to the nonvolatile memories and the data is stored in the nonvolatile memories (period 512). At this time, the data "AA55" stored in HL register that is one of the volatile memories is transferred to and stored in the nonvolatile memory.

After the microcontroller 500 finishes data transfer and data storage to the nonvolatile storage portion, the microcontroller 500 allows the power gate unit 130 to operate so as to stop power supply to each circuit block, and thereby the operation mode becomes Noff2 mode (period 513). In the period 513 in FIG. 11, power supply to the CPU_VDD terminal is stopped.

Next, operation verification of the microcontroller 500 in the shift from Noff2 mode to Active mode as illustrated in FIG. 5 is described.

The return from Noff2 mode to Active mode is started by supply of a low potential to the NMI_B terminal. When the low potential is supplied to the NMI_B terminal, the power gate unit 130 operates to restart power supply to each circuit block. Then, data stored in the nonvolatile memory is transferred to and stored in the volatile memory. At this time, the data "AA55" stored in the nonvolatile memory is transferred to and stored again in the HL register (period 514).

After return of data from the nonvolatile memory to the volatile memory is finished, the microcontroller 500 operates again in Active mode in response to the returned data (period 515).

Then, in the period 515, processes 597 and 598 are conducted so that data returned in the HL register is confirmed.

During the process 597, "22" detected from the "DATA" terminal when "0023" is detected from the "ADDR" terminal is an instruction code for transferring data stored in HL register to the external memory. Further, "FD" and "7F" that are subsequently detected from the "DATA" terminal mean an address "7FFD" of the external memory that is an address to which data is to be transferred (see FIG. 11 and FIG. 12B).

The microcontroller 500 transfers data in the HL register to the external memory in the process 598 following the process 597. As described above, the microcontroller 500 processes data in terms of bytes. In addition, the external memory stores one byte of data per address. Thus, the microcontroller 500 that have received an instruction of the process 597 transfers data as the low byte in HL register to the address "7FFD" in the external memory, and then transfers data as the high byte to an address "7FFE" in the external memory in the process 598.

As shown in FIG. 12B, in the process 598, the microcontroller 500 outputs "7FFD" to the ADDR terminal, and outputs "55" to the DATA terminal as data of the low byte in the HL register. At this time, a low potential is supplied to the MREQ_B terminal and the WR_B terminal, so that "55" is written into the address "7FFD" in the external memory.

Then, as shown in FIG. 12B, the microcontroller 500 outputs "7FFE" to the ADDR terminal, and outputs "AA" as data of the high byte in the HL register to the DATA terminal. At this time, a low potential is supplied to the MREQ_B terminal and the WR_B terminal, so that "AA" is written into the address "7FFE" in the external memory.

The measurement results of the ADDR terminal and the DATA terminal in the processes 597 and 598 show that data "AA55" is stored in the HL register in the period 515. Thus, it is confirmed that the microcontroller 500 holds data in the register 185 even when the microcontroller 500 is switched from Active mode to Noff2 mode with no power supply. In addition, it is also confirmed that the microcontroller 500 operated normally after the microcontroller 500 returned from Noff2 mode to Active mode.

In addition, it is also confirmed that necessary data is backed up in the nonvolatile memory of the register before power supply is stopped. In other words, the microcontroller 500 can start to execute processing for power supply stop before processing by the CPU finishes; therefore, flexibility in timing for power supply stop can be increased. It is also confirmed that the microcontroller can return from the low power consumption mode to the normal operation mode rapidly.

Example 2

A microcontroller was fabricated practically and operation thereof was verified. The operation verification is described in this example.

The microcontroller used for operation verification in this example has a circuit configuration and functions similar to those of the microcontroller 300 illustrated in FIG. 13.

Figure 14:
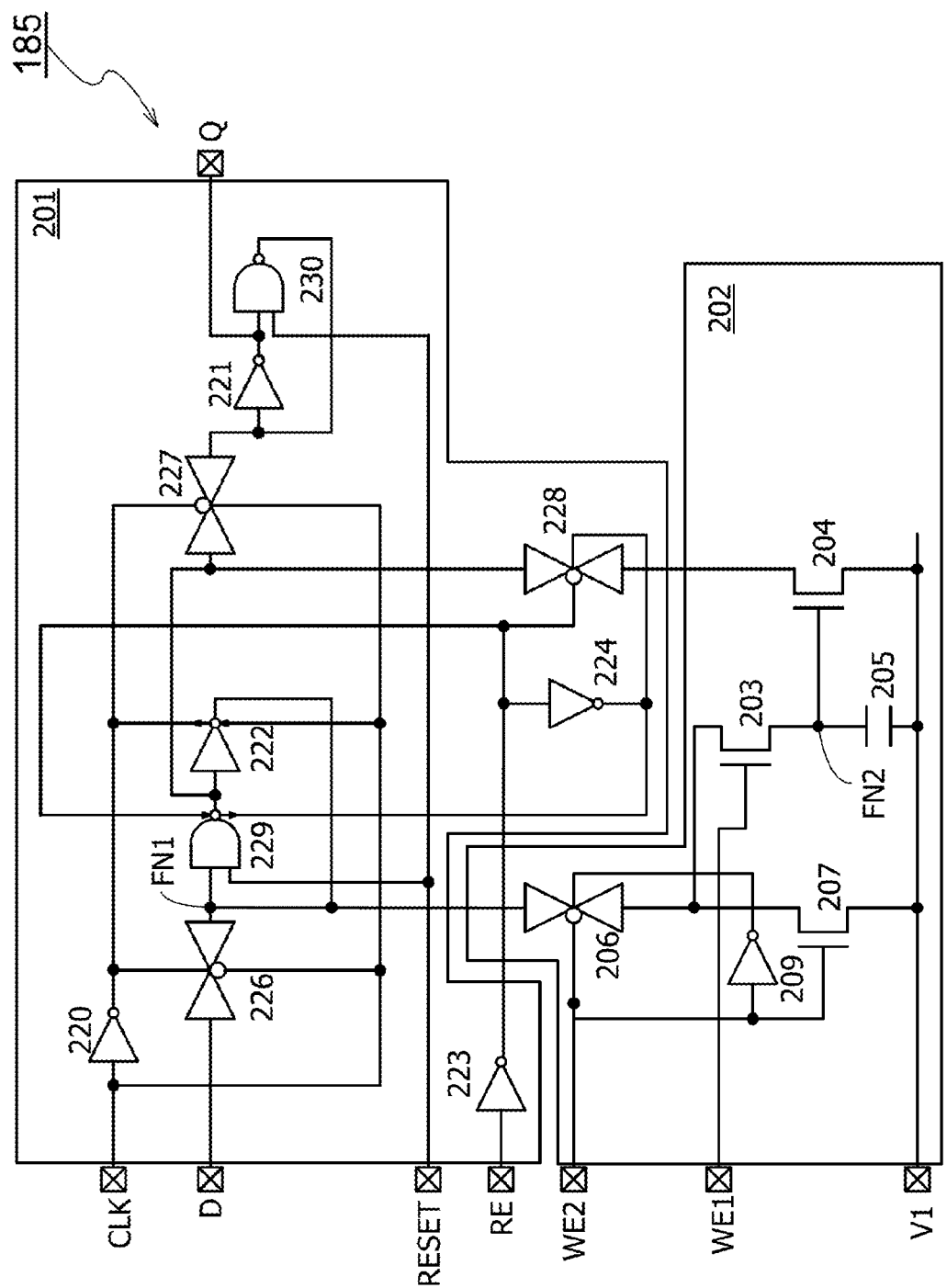
FIG. 14 is a circuit diagram illustrating an example of a register configuration.

A configuration of the register 185 included in the CPU 110 of the microcontroller used for operation verification is described first. FIG. 14 illustrates the configuration of the register 185 having a 1-bit memory capacity in this example.

The register 185 includes the memory circuit 201 and the memory circuit 202, like the register 200 illustrated in FIG. 6.

The memory circuit 201 includes the inverters 220 to 224, the transmission gates 226 to 228, and the NAND 229 and the NAND 230. In addition, the memory circuit 202 includes the transistor 203, the transistor 204, the capacitor 205, the transmission gate 206, the transistor 207, and the inverter 209.

The inverter 220 has a function of generating a clock signal CLKb which is an inverted signal obtained by inverting a polarity of a potential of the clock signal CLK. The transmission gate 226, the transmission gate 227, and the inverter 222 each determines output of a signal in response to the clock signal CLK and the clock signal CLKb.

Specifically, the transmission gate 226 supplies a signal D which has been received by an input terminal of the transmission gate 226 to a first input terminal of the NAND 229 and an input terminal of the transmission gate 206 included in the memory circuit 202, when the potential of the clock signal CLK is at a low (L) level and the potential of the clock signal CLKb is at a high (H) level. In addition, the transmission gate 226 takes high impedance and stops supply of the signal D to the first input terminal of the NAND 229 and the input terminal of the transmission gate 206 in the memory circuit 202, when the potential of the clock signal CLK is at a high level and the potential of the clock signal CLKb is at a low level.

Specifically, the transmission gate 227 supplies a signal which is outputted from an output terminal of the NAND 229 and an output terminal of the transmission gate 228, to an input terminal of the inverter 221, when the potential of the clock signal CLK is at a high level and the potential of the clock signal CLKb is at a low level. In addition, the transmission gate 227 stops supply of a signal which is outputted from the output terminal of the NAND 229 or the output terminal of the transmission gate 228, to the input terminal of the inverter 221, when the potential of the clock signal CLK is at a low level and the potential of the clock signal CLKb is at a high level.

In addition, the inverter 223 generates a signal REb which is an inverted signal obtained by interving a polarity of a potential of a signal RE. The inverter 224 generates the signal RE by inverting the polarity of a potential of the signal REb. The transmission gate 228 and the NAND 229 each determine output of a signal in response to the signal RE and the signal REb.

Specifically, the transmission gate 228 supplies a signal including data outputted from the memory circuit 202, to an input terminal of the transmission gate 227 and an input terminal of the inverter 222, when the potential of the signal RE is at high level and the potential of the signal REb is at low level. In addition, the transmission gate 228 takes high impedance and stops supply of a signal including data outputted from the memory circuit 202 to the input terminal of the transmission gate 227 and the input terminal of the inverter 222, when the potential of the signal RE is at a low level and the potential of the signal REb is at a high level.

The NAND 229 is a NAND having two inputs. To the first input terminal is supplied a signal D outputted from the transmission gate 226 or a signal outputted from the transmission gate 206 of the memory circuit 202, and to a second input terminal is supplied a signal RESET. Then, the NAND 229 outputs a signal in response to the signals inputted into the first input terminal and the second input terminal, when the potential of the signal RE is at a low level and the potential of the signal REb is at a high level. In addition, the NAND 229 takes high impedance and stops supply of a signal irrespective of the signal inputted to the first input terminal and the second input terminal, when the potential of the signal RE is at a high level and the potential of the signal REb is at a low level.

The inverter 222 inverts the polarity of the potential of a signal which is supplied to an input terminal of the inverter 222 and outputs the inverted signal, when the potential of the clock signal CLK is at a high level and the potential of the clock signal CLKb is at a low level. The outputted signal is supplied to the first input terminal of the NAND 229. In addition, the inverter 222 takes high impedance and stops supply of a signal to the first input terminal of the NAND 229, when the potential of the clock signal CLK is at a low level and the potential of the clock signal CLKb is at a high level.

The inverter 221 inverts the potentials of the signals outputted from the output terminal of the transmission gate 227 and the output terminal of the NAND 230, and outputs the inverted signals as signals Q. The signal Q outputted from the inverter 221 is supplied to the first input terminal of the NAND 230.

The NAND 230 is a NAND having two inputs, and the signal Q outputted from the inverter 221 is supplied to a first input terminal and the signal RESET is supplied to a second input terminal.

ON/OFF of the transistor 203 is controlled in response to the potential of the signal WE1. In addition, ON/OFF of the transmission gate 206 is controlled in response to the signal WE2. Specifically, in FIG. 14, ON/OFF of the transmission gate 206 is controlled by the signal WE2 and the signal which is obtained by inverting the polarity of the signal WE2 by the inverter 209. ON/OFF of the transistor 207 is controlled in response to the signal WE2.

When the transmission gate 206 and the transistor 203 are in on states, the potential corresponding to 1 or 0 of data in a node FN1 in the memory circuit 201 is supplied to a node FN2. In addition, when the transistor 203 and the transistor 207 are in on states, the potential V1 is supplied to the node FN2.

ON/OFF of the transistor 204 is controlled in response to the potential of the node FN2. When the transistor 204 is in an on state, the potential V1 is supplied to the memory circuit 201 through the transistor 204. When the transistor 203 is in an off state, the capacitor 205 stores the potential of the node FN2.

In the register 185 illustrated in FIG. 14, the transistor 203 is formed using a CAAC-OS film including an In—Ga—Zn based oxide, while the transistors other than the transistor 203 included in the register 185 are formed using silicon films. The transistor 203 and the capacitor 205 are stacked over the transistors formed using silicon films, like those illustrated in FIG. 8. By this structure, the area of the register 185 can be small.

Figure 15:
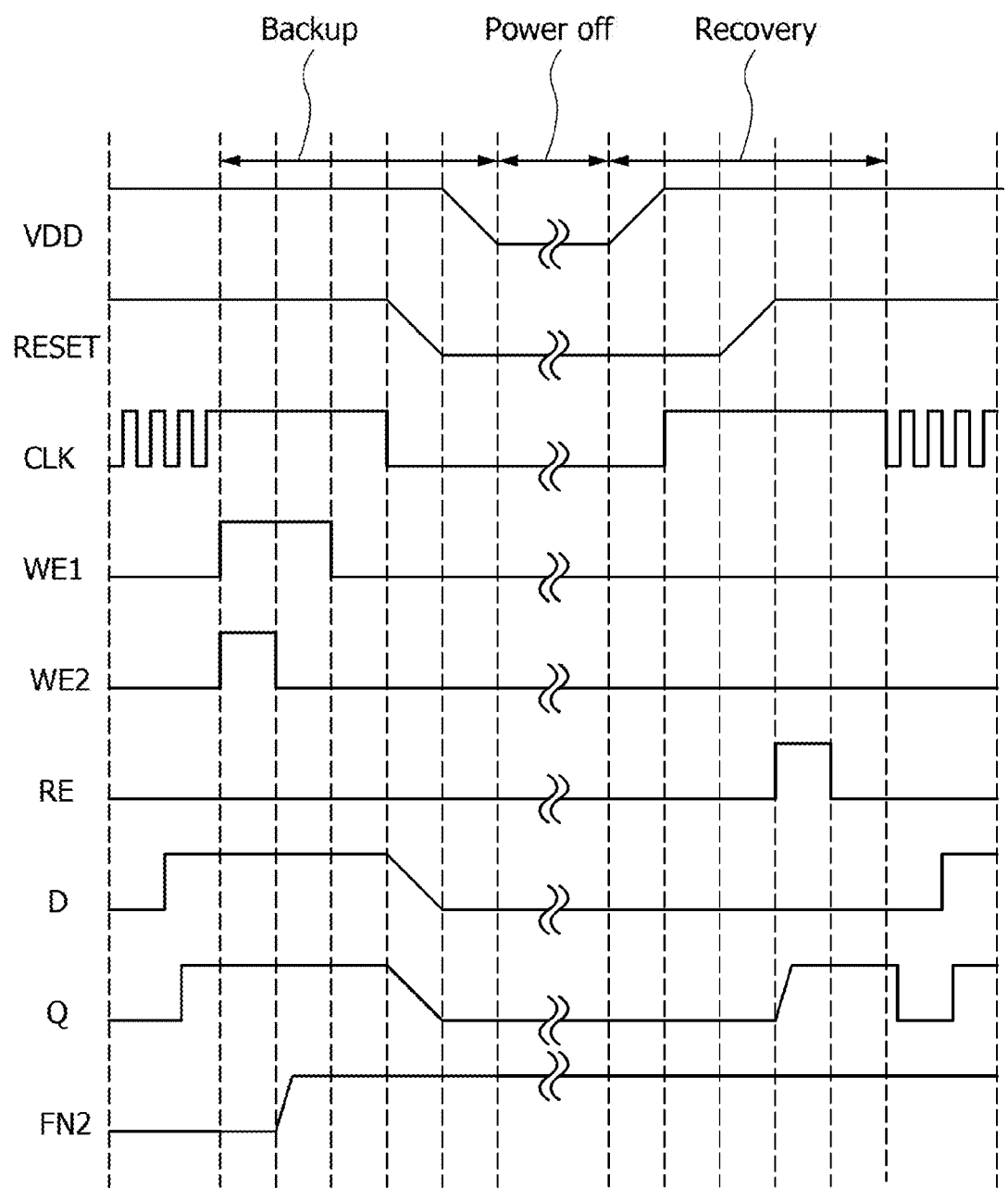
FIG. 15 is a timing chart of an operation example of a register.

FIG. 15 is a timing chart of potentials of an input signal, an output signal, a power supply potential, and the node FN2 at the time of data backup in the memory circuit 202 from the memory circuit 201, stop of power supply to the register 185, and data recovery from the memory circuit 202 to the memory circuit 201, in the register 185 illustrated in FIG. 14.

When the microcontroller is in Active mode, the potential of the signal WE2 is at a high level and the potential of the signal RE is at a low level, so that the memory circuit 201 is electrically isolated from the memory circuit 202. Thus, the register 185 can have a function similar to that of a typical flip-flop. Further, a circuit specific to data backup in the memory circuit 202 and the data recovery from the memory circuit 202 is not needed.

In the register 185 illustrated in FIG. 14, electric power for writing data in the memory circuit 202 is lower than that in a register using an MRAM. This is because electric power for writing data in the memory circuit 202 depends largely on a capacitance of the capacitor 205, and off-state current of the transistor 203 formed using a CAAC-OS film including an In—Ga—Zn based oxide is low, which can reduce the capacitance of the capacitor 205. The register using an MRAM needs large electric power for data backup, and thus it is difficult to back up data at the same timing in all registers if MRAMs are used for all the registers in the microcontroller. However, in accordance with one embodiment of the present invention, electric power for data backup is small, and thus it is easy to back up data at the same timing in all registers when all the registers arranged in the microcontroller have the structure illustrated in FIG. 14.

Table 4 shows characteristics of the register 185 included in the experimentally fabricated microcontroller and other nonvolatile memory cells. Thus, unlike the current-driven type nonvolatile memory cells, when the register 185 in the microcontroller has several hundreds of bits, data backup process can be conducted at the same timing. Further, the power overhead is small, which leads to effective normally-off driving.

TABLE 4

| | Register185 | STT-MRAM | NOR Flash |
|---|---|---|---|
| Backup Operation Voltage (V) | 2 | 1.8 | 10 |
| Storage Capacitor (fF) | 110 | | |
| Backup Period | 500 ns | 35 ns | 1 μs/10 ms |
| Backup Energy (J/bit) | 2.2E−13 | 2.5E−12 | 1.0E−10 |

Then, as for the microcontroller in this example, when the register 185 illustrated in FIG. 14 is used for the CPU 110, power consumption is evaluated in operation of data backup in the memory circuit 202 (Driving 1) and operation without data backup in the memory circuit 202 (Driving 2).

Figures 16A, 16B:
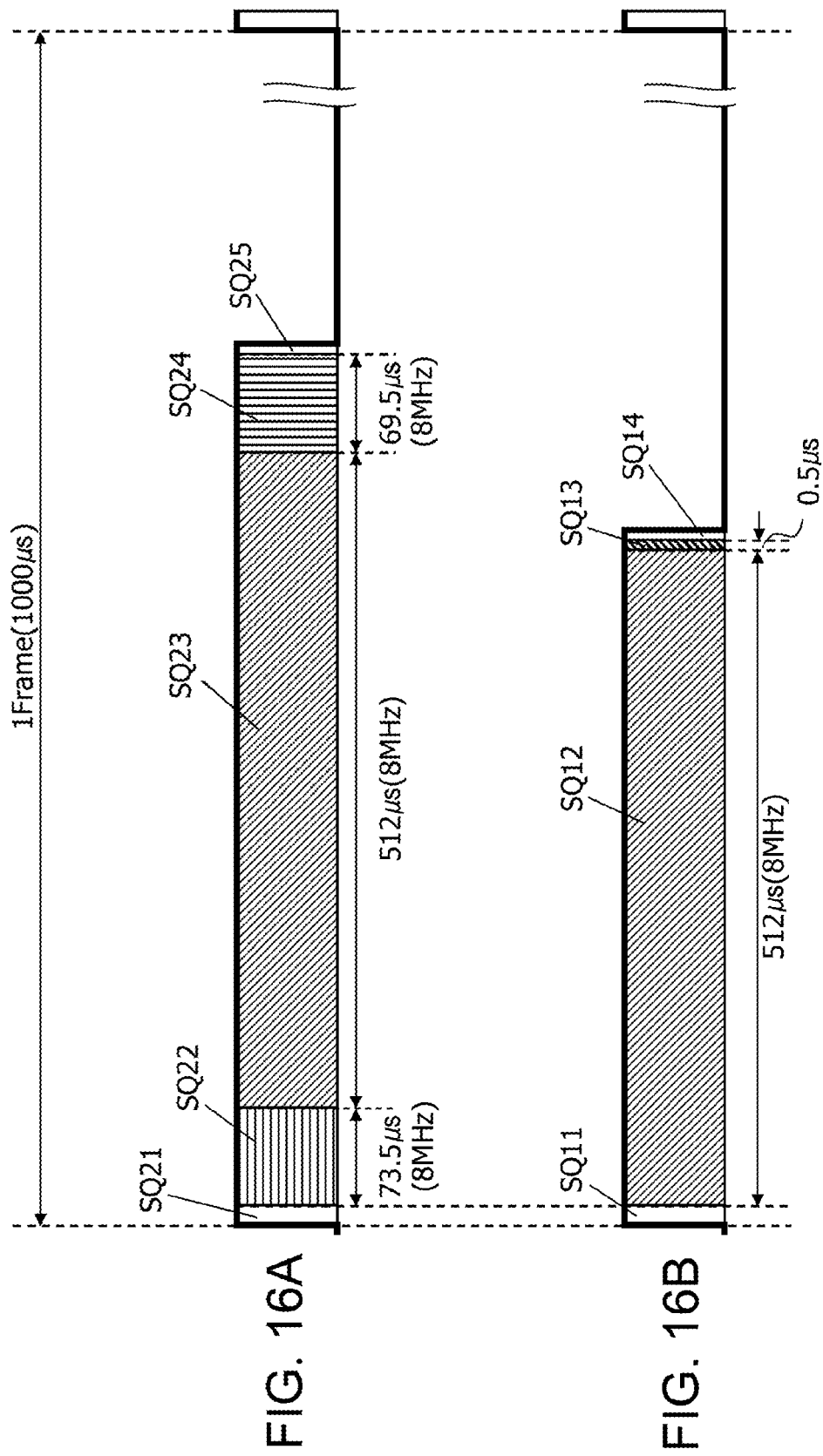
FIGS. 16A and 16B are diagrams illustrating sample programs used for evaluation of power consumption.

Driving 1 and Driving 2 employed a sample program in which Active mode and Noff2 mode are repeated simply. FIGS. 16A and 16B show sequences of the sample programs used for evaluation of power consumption. The repetition cycle of Active mode and Noff2 mode is defined as a frame period. In the example of FIGS. 16A and 16B, one frame period is 1000 μs and the driving frequency is 8 MHz. In evaluation of power consumption of Driving 1, data writing process to the register 185 is added to the sample program. In evaluation of power consumption of Driving 2, data backup process and data recovery process are added to the sample program. In both Driving 1 and Driving 2, processing conducted in Active mode (main processing) is identical, that is, output processing to the I/O port 150 and incremental processing of the register 185 are conducted.

As shown in FIG. 16B, in Driving 1 (Distributed backup method), main processing (SQ12), data backup processing to the memory circuit 202 (SQ13), and power off sequence (SQ14) are conducted sequentially after power recovery sequence (SQ11). The power recovery sequence (SQ11) in Driving 1 included processing of data recovery from the memory circuit 202 to the memory circuit 201. The main processing (SQ12) takes 512 μs and the data backup processing to the memory circuit 202 (SQ13) takes 0.5 μs. In addition, as shown in FIG. 16A, in Driving 2 (Centralized backup method), data recovery processing (SQ22), main processing (SQ23), data backup processing (SQ24), and power off sequence (SQ25) are conducted sequentially after power recovery sequence (SQ21). The data recovery processing (SQ22) takes 73.5 μs, the main processing (SQ23) takes 512 μs and the data backup processing (SQ24) takes 69.5 μs.

Figure 17:
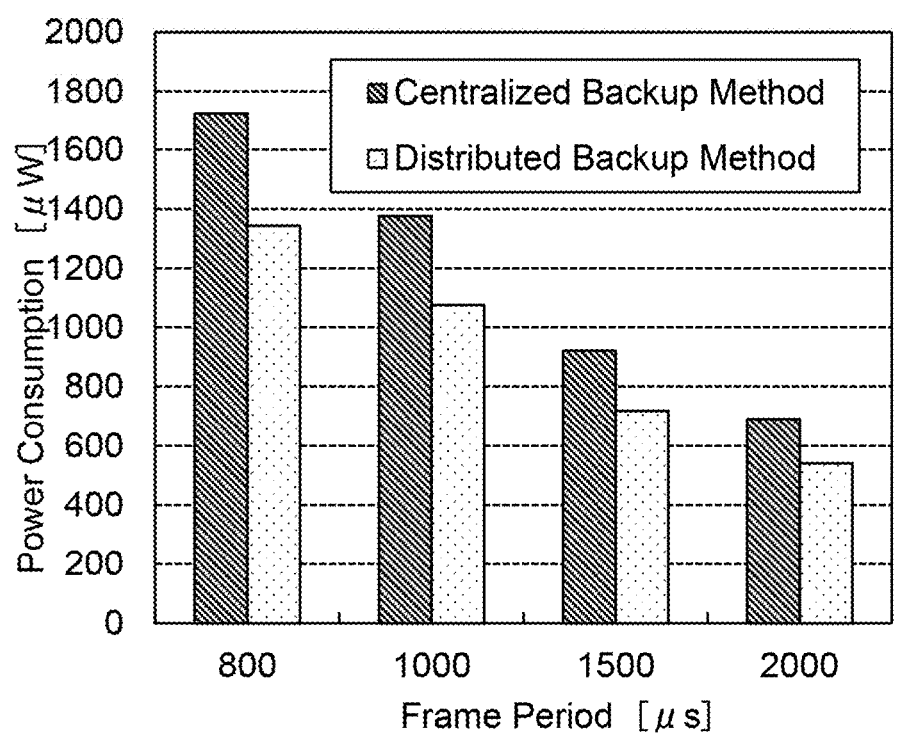
FIG. 17 is a graph showing evaluation results of power consumption by Driving 1 and Driving 2.

Evaluation results of power consumption of Driving 1 (Distributed backup method) and Driving 2 (Centralized backup method) are shown in FIG. 17. As shown in FIG. 17, when the frame period is 1000 μs and the driving frequency is 8 MHz, the power consumption of Driving 1 is 1075.4 μW and the power consumption of Driving 2 is 1376.3 μW; therefore, about 22% of power consumption of the microcontroller is reduced in Driving 1 compared to in Driving 2. Further, it is shown that when the frame period is 500 μs and the driving frequency is 8 MHz, the power consumption of Driving 1 is lower by about 227.95 μW than that of Driving 2. The difference in power consumption results from the fact that power consumed by data backup in the memory circuit 202 and data recovery from the memory circuit 202 in the register 185 is smaller than power consumed by data backup from the register 185 and data recovery to the register 185.

Figure 18:
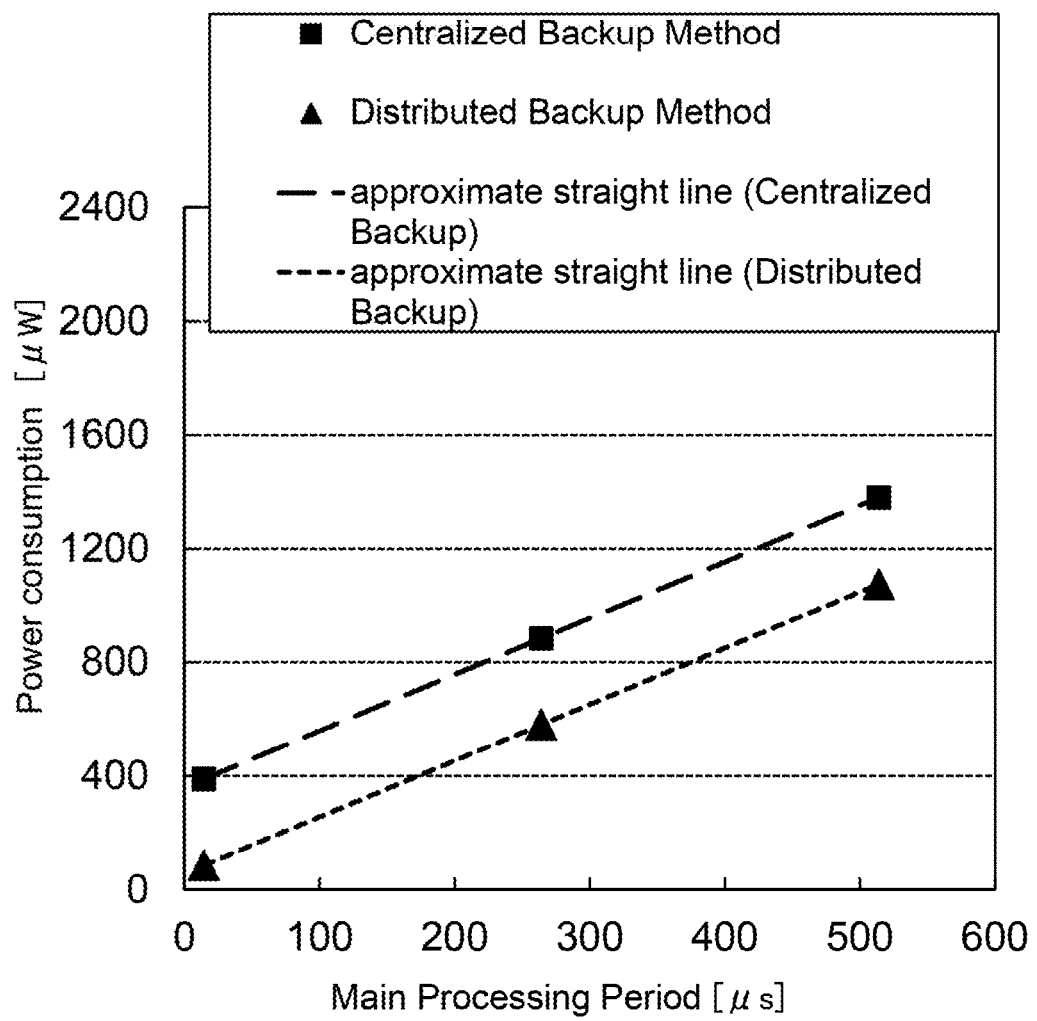
FIG. 18 is a graph showing measurement results of power consumption with respect to a main processing period in Driving 1 and Driving 2 and the approximate straight lines (dotted lines)

Next, FIG. 18 shows measurement results of power consumption with respect to the main processing period in Driving 1 and Driving 2, and approximate straight lines (dotted lines) thereof. The period of the main processing is changed by shifting the number of increment processing. The approximate straight line of power consumption with Driving 1 is represented by the expression y=1.98x+57.52, while the approximate straight line of power consumption with Driving 2 is represented by the expression y=1.98x+360.64. The intercepts of the approximate straight lines correspond to overhead power. Thus, as apparent from FIG. 18, the overhead power of Driving 1 (Distributed backup method) is smaller by about 84% [($\approx$1-57.52/360.64) 100%] than that of Driving 2 (Centralized backup method).

Figures 19A, 19B:
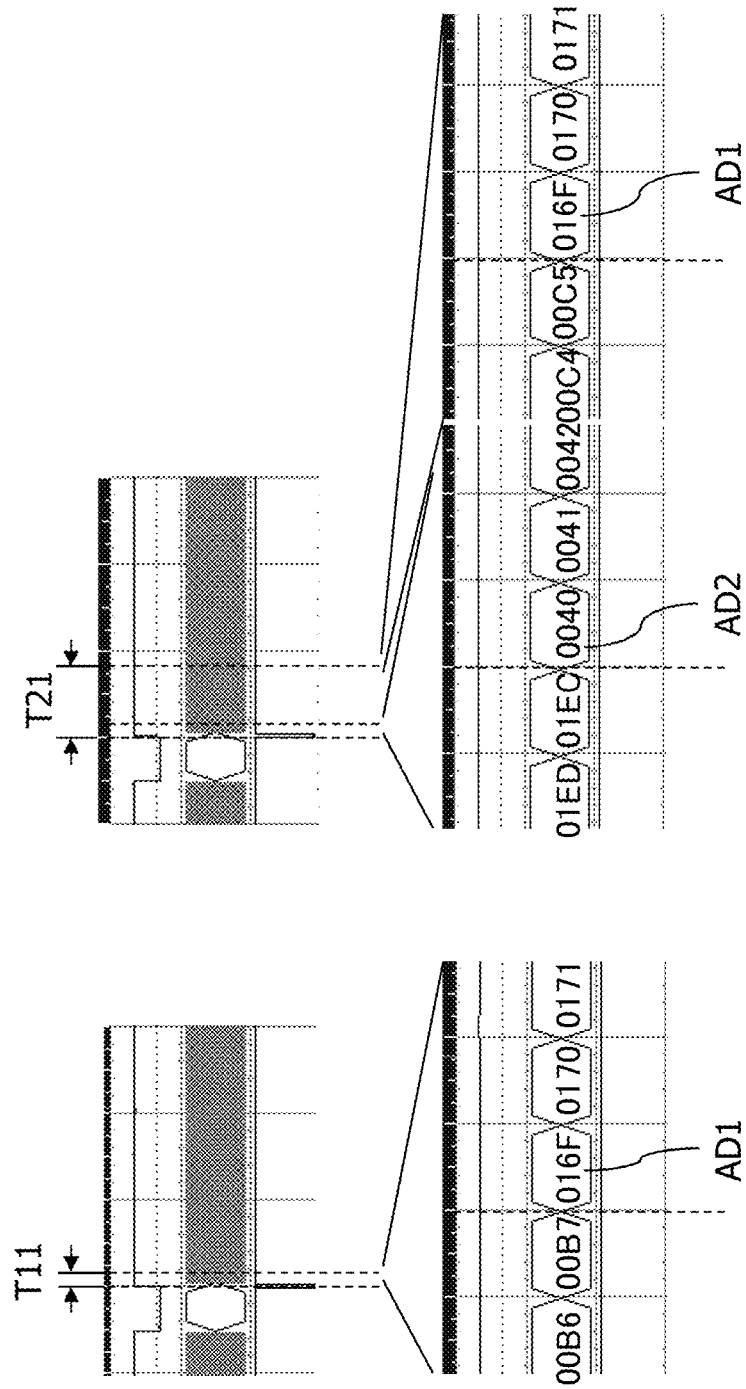
FIG. 19A and FIG. 19B are sequence diagrams from the restart of power supply to the start of main processing (FIG. 19A shows Driving 1 and FIG. 19B shows Driving 2)

Next, FIGS. 19A and 19B show measurement results of signal waveforms when the sample programs (sequences up to the start of main processing after power supply restarts) are executed. The driving frequency is 8 MHz. FIG. 19A shows an example of Driving 1 in which an enlarged view of a signal waveform of a period T11 (=14.53 μs) after the power recovery sequence (SQ11) is started, and addresses of signals. FIG. 19B shows an example of Driving 2 in which an enlarged view of a signal waveform of a period T21 (=88.96 μs) after the power recovery sequence (SQ21) is started, and addresses of signals. Note that in FIGS. 19A and 19B, "AD1" denotes a main processing start address and "AD2" denotes data recovery processing start address.

In Driving 1, main processing is started immediately after power supply is restarted. Thus, it is shown that the time needed for the start of main processing after power supply is restarted in Driving 1 is shorter by about 74 us than that in Driving 2, at the operation of 8 MHz driving frequency.

The time to be saved is increased in proportion to the number of registers included in the CPU and analog/digital peripheral circuits of the microcontroller. For this reason, the following effect can be expected: as the number of registers used in a high-functional microcomputer is increased, the time needed for start of main processing after power supply restarts can be further shortened.

Example 3

A microcontroller was fabricated practically and operation thereof was verified. The operation verification is described in this example.

Figure 20:
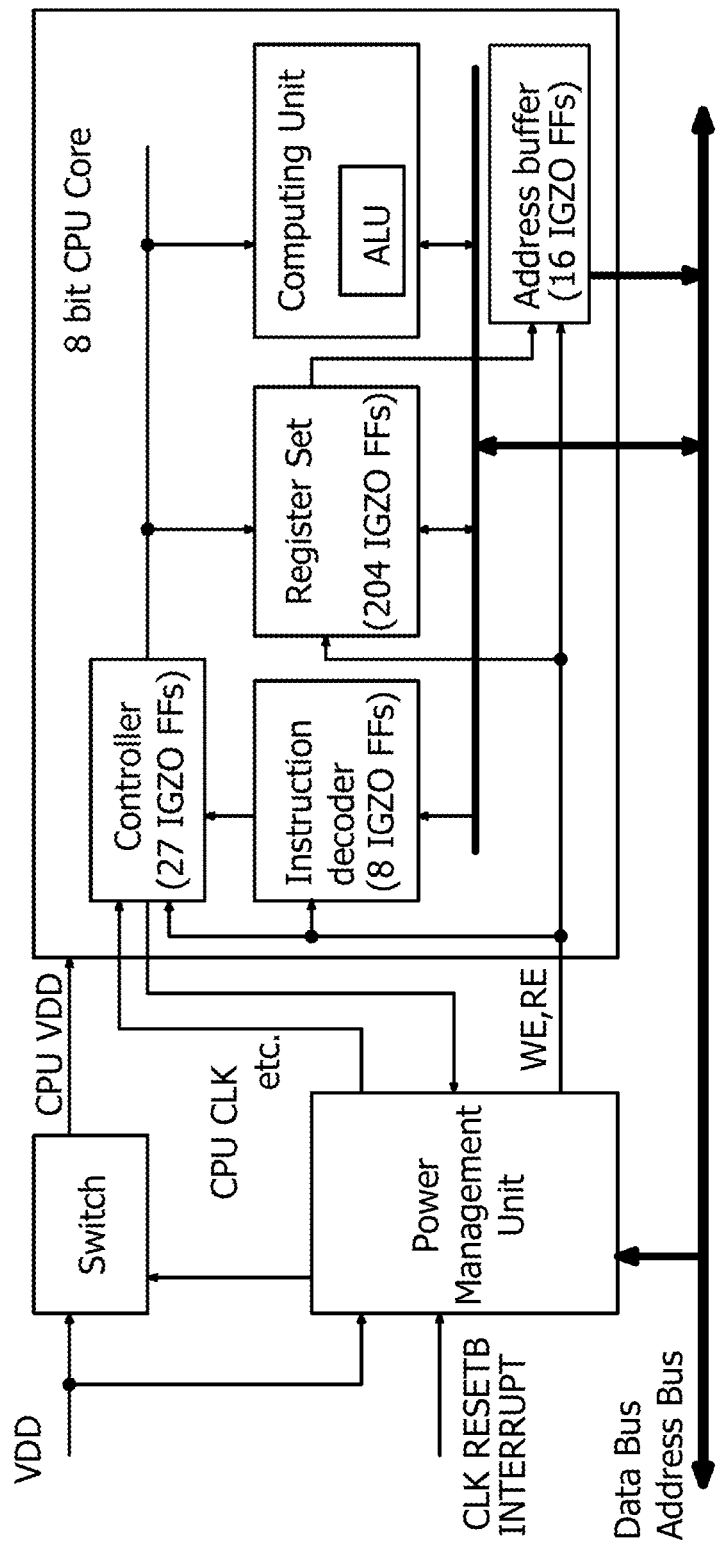
FIG. 20 is a block diagram illustrating a microcontroller configuration.

FIG. 20 illustrates a configuration of the microcontroller used for operation verification in this example. The microcontroller includes an 8-bit CISC CPU core having registers (IGZO FF) including transistors formed using IGZO (In—Ga—Zn-oxide) and a power management unit (PMU). The CPU includes an instruction for power gating in addition to an instruction set such as one used in Z80.

Figure 21:
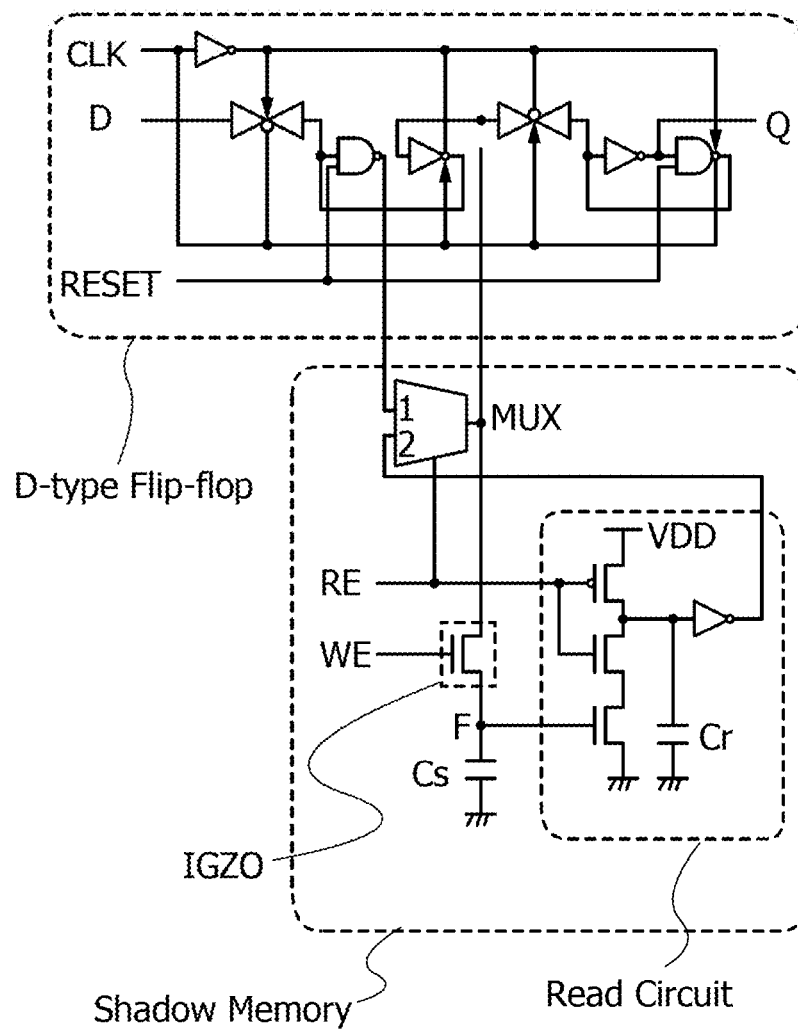
FIG. 21 is a circuit diagram illustrating an example of a register configuration.

FIG. 21 is a circuit configuration of the IGZO FF. The IGZO FF additionally includes a shadow memory in which a transistor using IGZO (IGZO FET) is used for a D-type flip-flop (DFF) in order not to give an influence on a normal operation speed.

Figure 22:
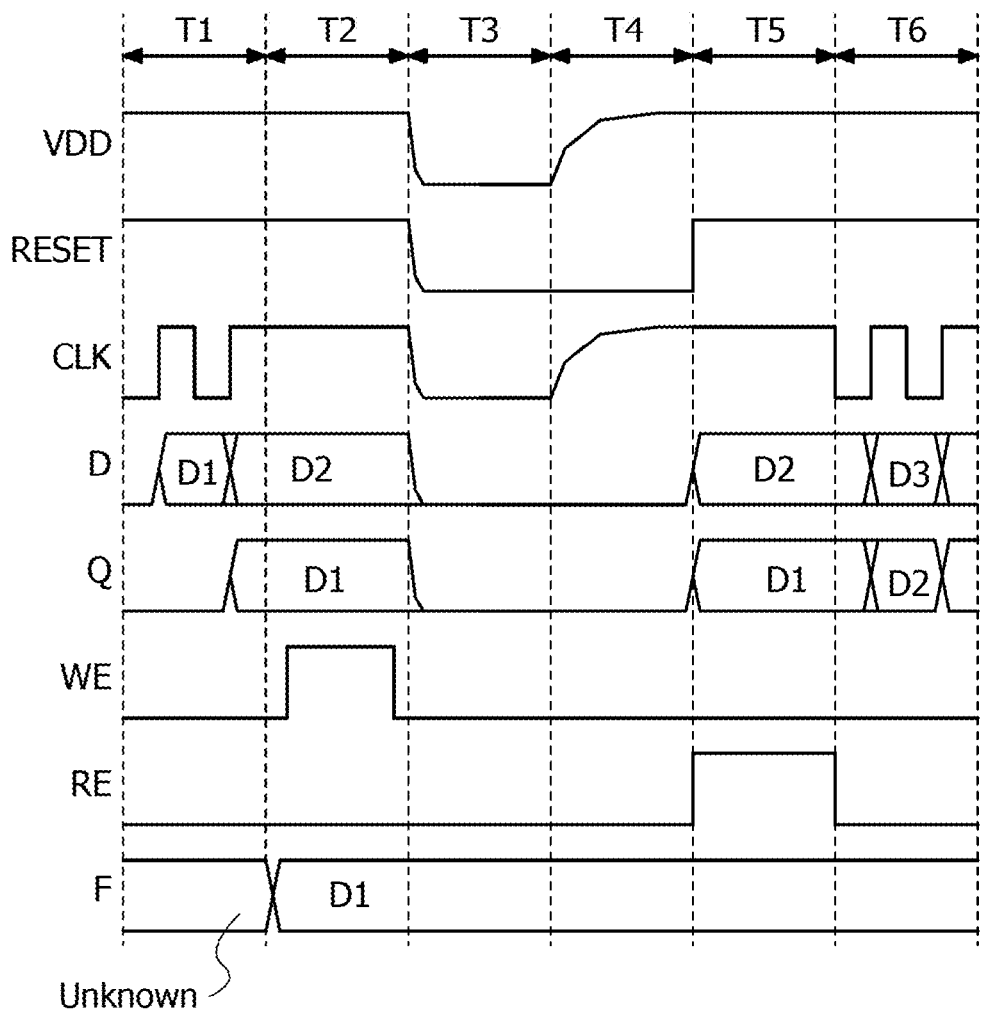
FIG. 22 is a timing chart of an operation example of the register.

FIG. 22 is a timing chart of the IGZO FF. In the normal operation (T1), a normal DFF is structured in such a manner that a terminal 1 of a multiplexer (MUX) is selected with RE having a potential at a low level. Data writing (T2) to the shadow memory is conducted by fixing the potential of CLK at a high level to determine data of DFF and setting the potential of WE at a high level. In the power off period (T3), the potential (data) of the node F is stored by WE having the potential at a low level. In the power recovery period (T4), by setting the potential of RE at a low level, the capacitor Cr is charged. Data readout (T5) from the shadow memory is conducted by setting the potential of RE at a high level and discharging charge in the capacitor Cr in accordance with the potential of the node F.

Figure 23:
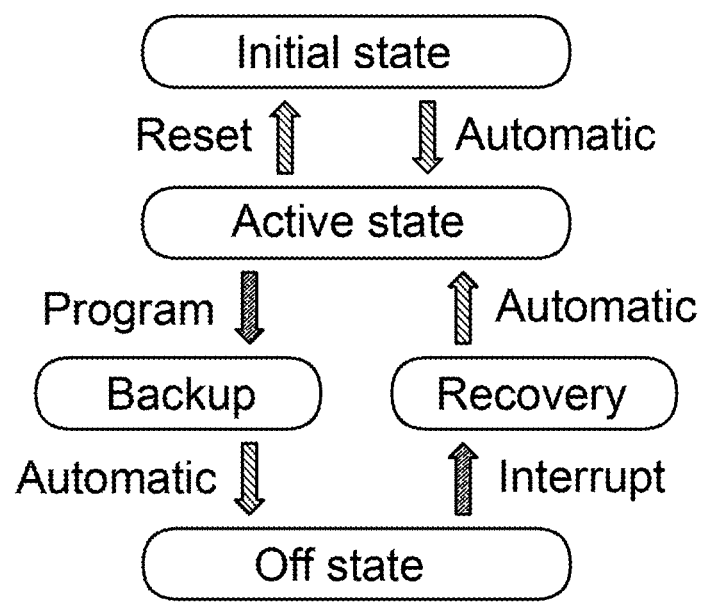
FIG. 23 is a state transition diagram of a PMU.

FIG. 23 is a state transition diagram of the PMU. The backup operation is controlled by a program and the recovery operation is controlled by an interrupt signal. The backup time and the recovery time are times which are programmable for evaluation. The backup operation required ($n_1$+33) clocks and the recovery read required $n_2$ clocks for power recovery and 4 clocks for read operation. The terms $n_1$ and $n_2$ are selected from the range of 1 to 4096 and the range of 51 to 65586 respectively.

The microcontroller is fabricated by a hybrid process using a SiFET having a channel length L of 0.5 μm and an IGZO FET having a channel length L of 0.8 μm. Table 5 below shows measurement results of the IGZO FF (FF1) used practically. The FF1 has a 1-pF storage capacitor Cs and IGZO FET with L/W=0.8/0.8 μm in the IGZO storage portion. The write time (T2) is 500 ns and the readout time (T5) is 10 ns (VDD=2.5 V and VH=3.2 V).

TABLE 5

| | $L_{IGZO}$ | Cs | $L_{Si}$ | Endurance | Write time | Write energy | Read time | Retention *3 |
|---|---|---|---|---|---|---|---|---|
| FF1 | 0.8 μm | 1 pF | 0.5 μm | >10$^{11}$ *1 | 500 ns *1 | 3.1 pJ *2 | 10 ns *1 | >10 y |
| FF2 | 0.3 μm | 2 fF | 30 nm | — | 6.4 ns *2 | 3.7 fJ *2 | — | 69 days |

*1 Experimental results
*2 Estimated through HSPICE simulation at ($V_{DD}$, $V_H$) = (2.5 V, 3.2 V) (FF1), and(1 V, 3 V) (FF2)
*3 Estimated as t $\tilde{}$ Cs × ΔV/$I_{off}$ for $I_{off}$ = 135 yA/μm and ΔV = 1 V (FF1), 0.4 V (FF2)

Figure 24:
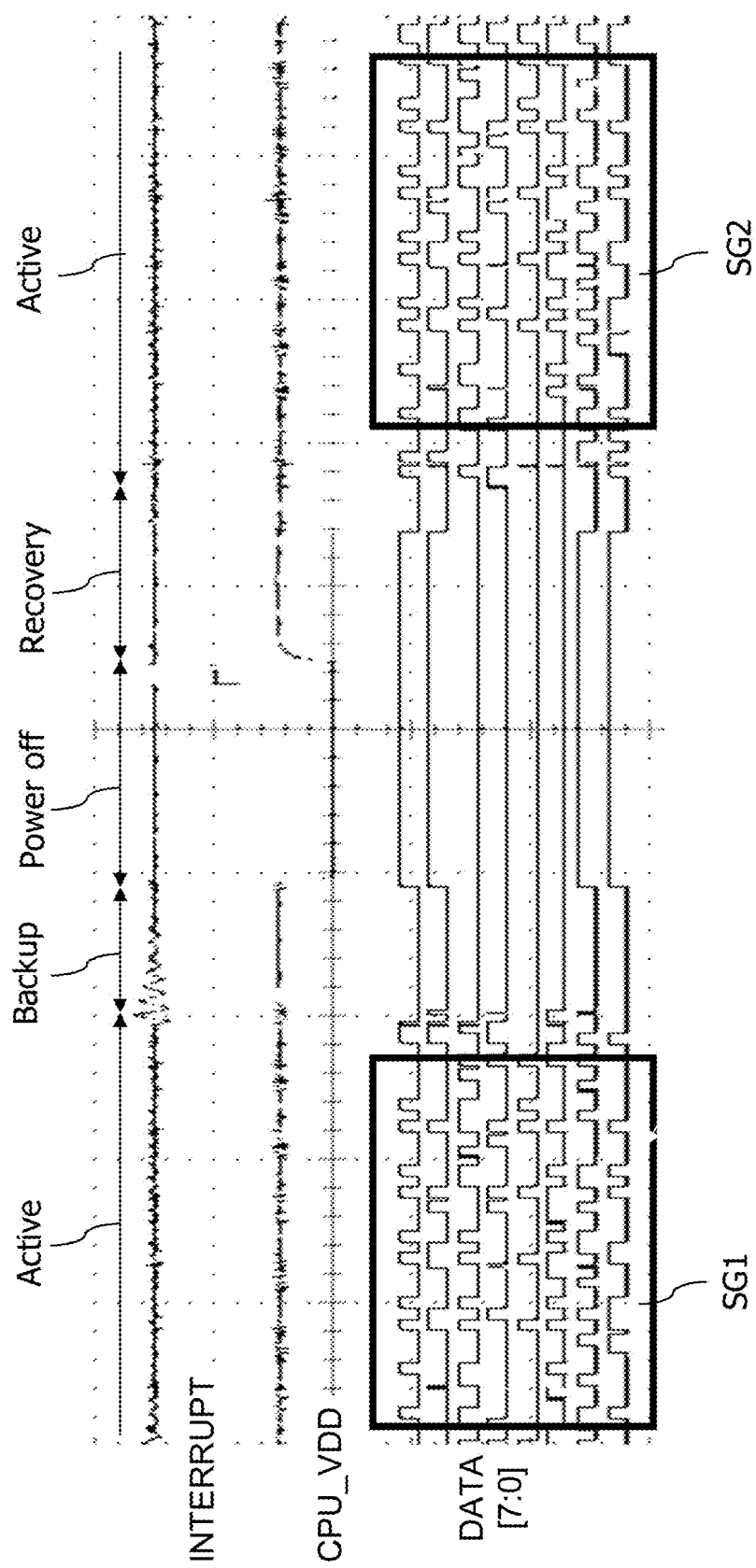
FIG. 24 is a diagram showing an operation waveform of power gating.

FIG. 24 is a diagram showing operation waveform of power gating when backup in 1.8 μs ($n_1$=12), power off in 3.0 μs, and recovery in 2.2 μs ($n_2$=51) are conducted at a frequency of 25 MHz. As apparent from FIG. 24, signal waveforms SG1 and SG2 had the same data patterns, and thus the values of 88-bit general purpose registers accessible are the same before and after power off, and power gating functioned normally. Further, in a test program including LOAD, ADD, and STORE for verification of power gating, even when power gating is inserted between all instructions, a correct result are obtained.

Figure 25A:
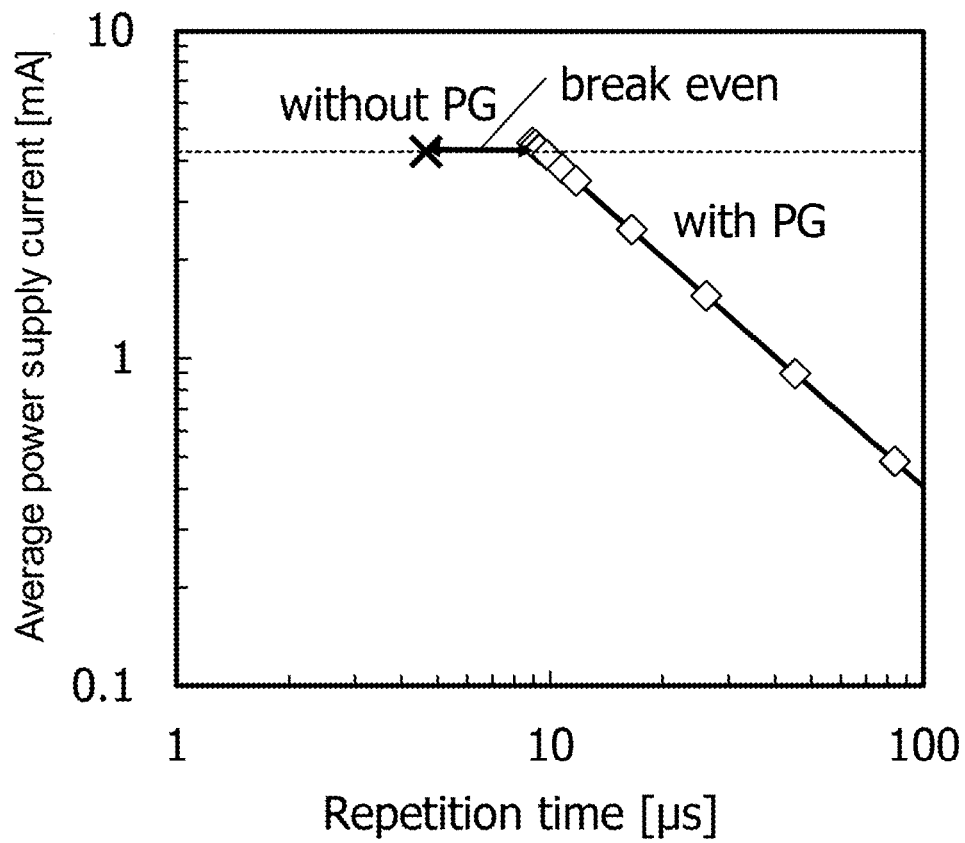
FIG. 25A is a graph showing a correlation between an average power supply current and a repetition time.
Figure 25B:
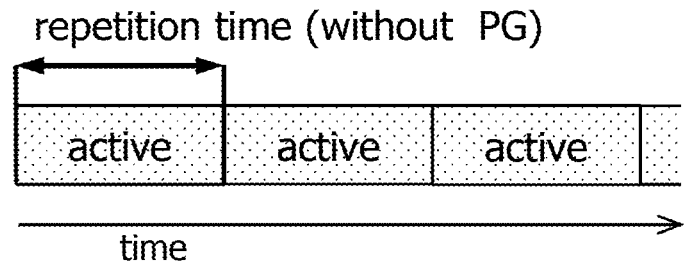
FIGS. 25B and 25C are diagrams illustrating the repetition time.
Figure 25C:
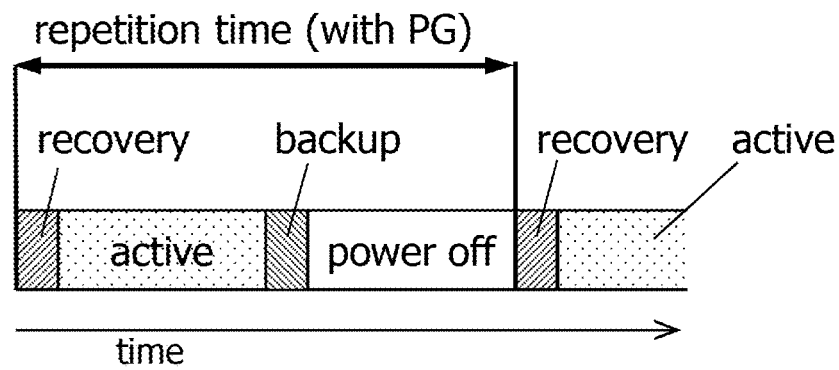

FIG. 25A is a graph showing a correlation between average power supply current and repetition time at a driving frequency of 25 MHz. Here, the repetition time means one cycle from an active process period till the start of a subsequent active process period as shown in FIGS. 25B and 25C. In other words, the repetition time is a period in which one test program is executed as shown in FIG. 25B when power gating (PG) is not executed, whereas the repetition time is a period in which one test program and one power gating are executed as shown in FIG. 25C when power gating is executed. The power gating includes data recovery processing after the restart of power supply and data backup processing before the stop of power supply. As shown in FIG. 25A, the break-even time (BET) is 4.9 µs at 25 MHz. The BET corresponds to a time of power off in which power consumed by data backup and data recovery (overhead power) and power reduced by power supply stop are equal to each other. Specifically, the energy consumption by all the capacitors is 42% (calculated by computer) and the energy consumption by the PMU is 39% (measurement value), while the energy consumption by writing data is as low as less than 2% (calculated by computer). For that reason, the IGZO FF is suitable for power gating having fine temporal granularity.

Figure 26:
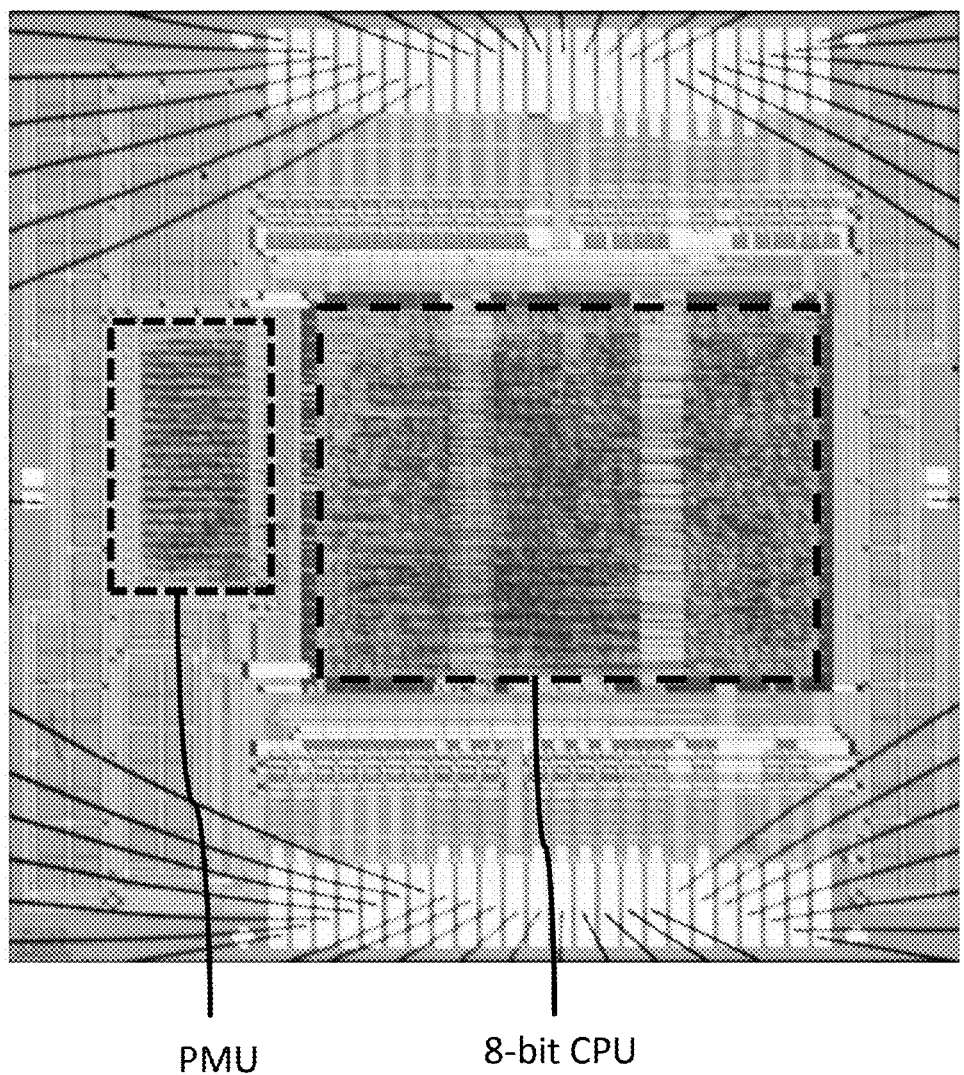
FIG. 26 is a photograph of a chip including a microcontroller.

FIG. 26 is a photograph of a chip including a microcontroller. Table 6 below shows features of the chip.

TABLE 6

| Architecture | | 8-bit CISC |
| --- | --- | --- |
| Technology (µm) | Si FET | 0.5 |
| | IGZO FET | 0.8 |
| Core size (mm × mm) | | 4.5 × 3.3 |
| Transistor count | | about 30,000 |
| IGZO FF count | | 255 |
| CLK freq. (MHz) | | 25 |
| Power Supply (V) | Si FET | 2.5 |
| | IGZO FET | 3.2 |
| Break even time (µs) | | 4.9 |

An IGZO FF (FF2) fabricated by 30 nm Si technology is evaluated by computer calculation. In the FF2, an IGZO FET with L/W=0.3/0.3 µm and a 2-fF storage capacitor Cs are used in the shadow memory. These values are set to give the IGZO FET favorable characteristics but not to cause an area overhead of the IGZO FET.

Figure 27:
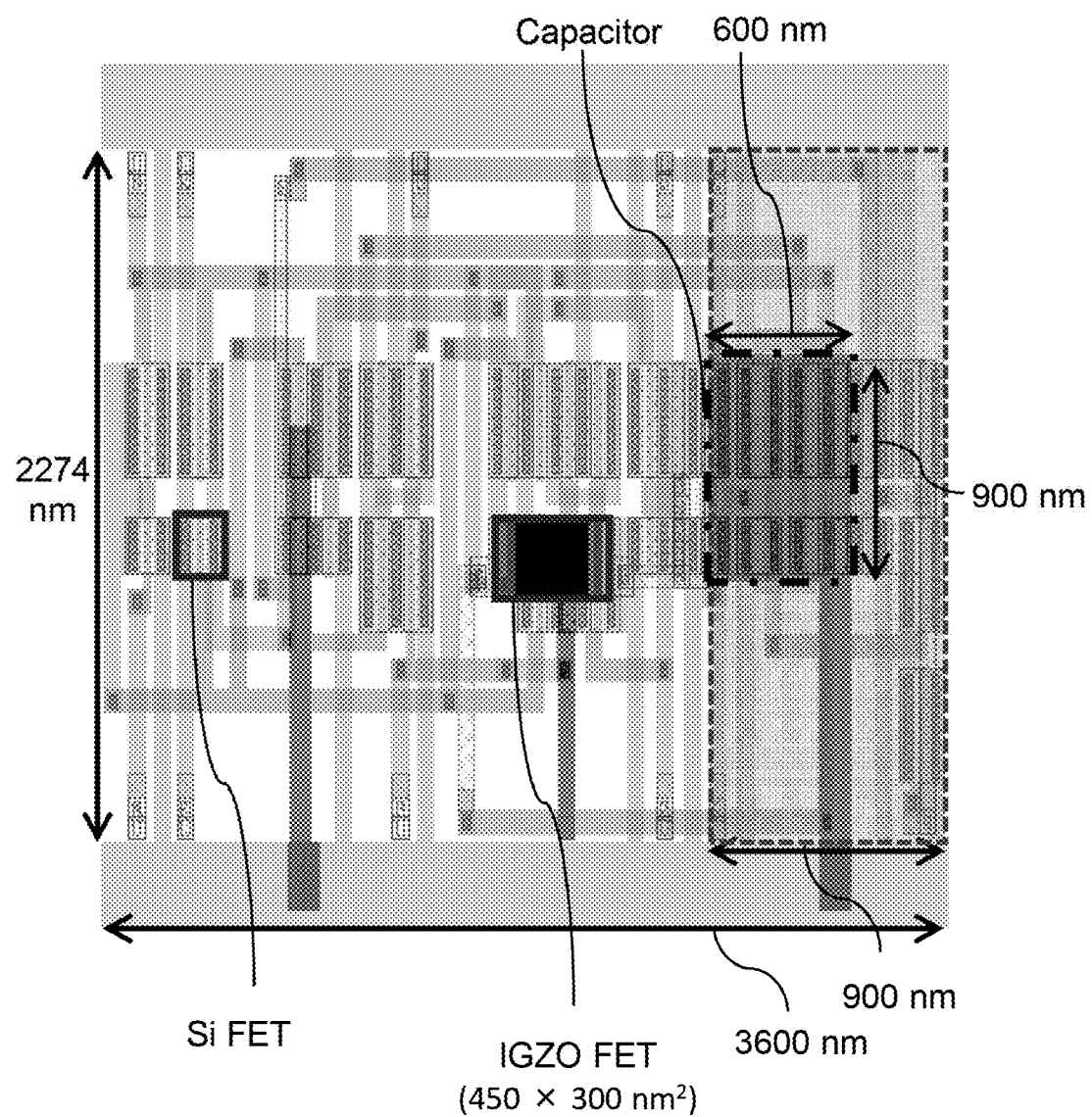
FIG. 27 is a layout diagram of an FF2.
Figure 28:
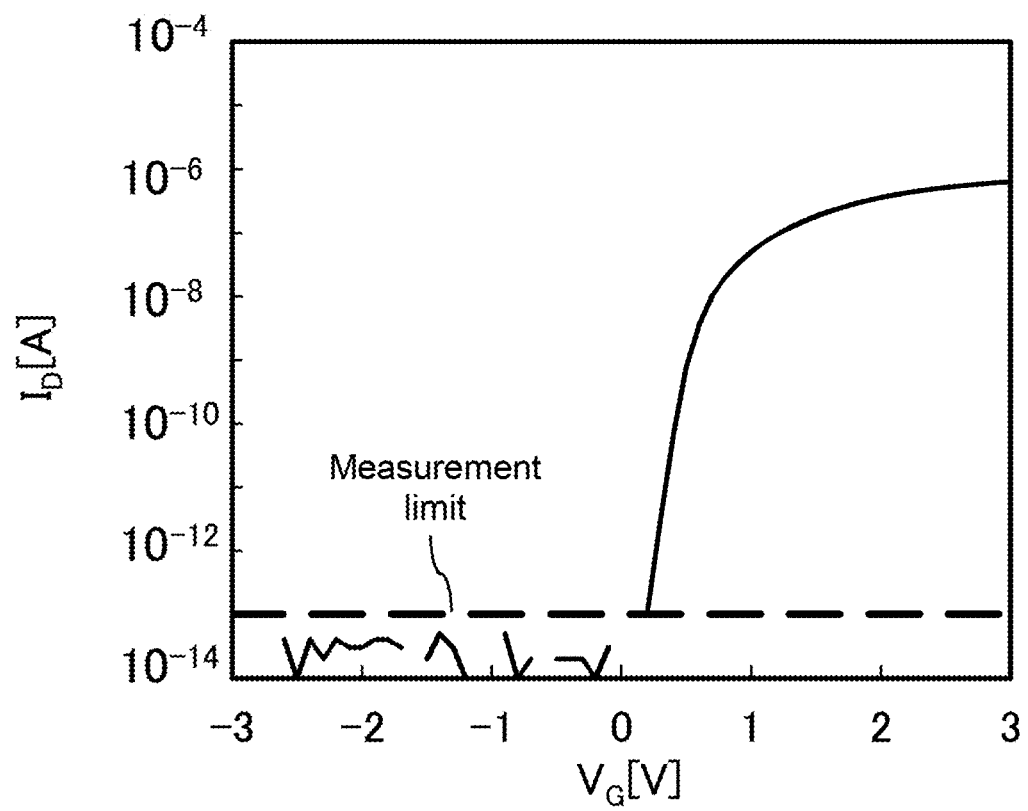
FIG. 28 is a graph showing $V_G$-$I_D$ characteristics of an experimentally-fabricated FET.

FIG. 27 is a layout diagram and the sizes of main parts of the FF2. The area of a Si circuit including MUX and a read circuit is larger by 25% than that of DFF, that is, 8.19 µm². In contrast, the area of the IGZO FET stacked is 0.14 µm² and the area of the capacitor Cs (equivalent oxide thickness, $t_{OX}$=10 nm) is 0.54 µm², which are both small. FIG. 28 is a graph showing $V_G$-$I_D$ characteristics of the experimentally-fabricated IGZO FET with L/W=0.3/0.3 µm. It is confirmed that the IGZO FET is normally off when L is 0.3 µm and that the off-state current is smaller than the lower limit of measurement. Note that the thickness of a gate insulating film in the IGZO FET is 10 nm ($t_{OX}$, equivalent oxide thickness) and the drain voltage ($V_D$) at the measurement is 1 V.

Table 5 above shows features of the FF2. Write characteristics of 6.4 ns and 3.7 fJ (VDD=1V and VH=3V) are obtained by HSPICE (circuit simulator). This means that the fabricated microcontroller is suitable for power gating having fine temporal granularity, even when a 30-nm Si technology is used. Note that the write energy is one order of magnitude smaller than a MTJ component that has been used recently. The area overhead of the fabricated microcontroller is 5.7%. In this figure, the overhead of IGZO FF is 1.7% and the overhead of PMU is 4.0%. The area overhead of a processor such as a microcontroller is decreased as the processor is further miniaturized. This is because the area overhead of PMU is decreased, as the CPU is further complicated and further scaled up.

EXPLANATION OF REFERENCE

MCLK, TCLK: clock signal, T0IRQ, P0IRQ, C0IRQ, NT, NMI: interrupt signal, 100, 190, 500: microcontroller, 101 to 104: unit, 110: CPU, 111: bus bridge, 112: RAM, 113: memory interface, 115: clock generation circuit, 120: controller, 121: interrupt controller, 122, 146, 152: I/O interface, 130: power gate unit, 131, 132: switch circuit, 140: clock generation circuit, 141: crystal oscillation circuit, 142: oscillator, 143: quartz crystal unit, 145: timer circuit, 150: I/O port, 151: comparator, 161 to 163: bus line, 164: data bus line, 170 to 176: connection terminal, 180, 183 to 187: register, FN, FN1, FN2: node, 200: register, 201, 202: memory circuit, 203, 204, 207: transistor, 205: capacitor, 206: transmission gate, 209: inverter, 220 to 224: inverter, 226 to 228: transmission gate, 229, 230: NAND, 300: microcontroller, 301: BUS, BL: bit line, RWL: word line, WWL: word line, 400: memory cell, 401 to 403: transistor, 404: capacitor, 405: power supply line, 511 to 515, 591, 592: period, 596 to 598: process, 800: semiconductor substrate, 801: element isolation insulating film, 802: p-well, 803, 807: impurity region, 804, 808: low concentration impurity region, 805, 809: gate electrode, 806, 831: gate insulating film, 810 to 813, 817 to 820, 822, 823: wiring, 816, 821, 824, 844, 845: insulating film, 830: oxide semiconductor layer, 832, 833, 846: conductive film, 834: gate electrode, 835, 836: sidewall, 860 to 862: transistor.

This application is based on Japanese Patent Application serial no. 2012-192956 filed with Japan Patent Office on Sep. 3, 2012, Japanese Patent Application serial no. 2012-229765 filed with Japan Patent Office on Oct. 17, 2012, Japanese Patent Application serial no. 2013-008407 filed with Japan Patent Office on Jan. 21, 2013, and Japanese Patent Application serial no. 2013-063267 filed with Japan Patent Office on Mar. 26, 2013, the entire contents of which are hereby incorporated by reference.

The invention claimed is:
1. A microcontroller comprising:
a timer circuit;
a first register electrically connected to the timer circuit;
a CPU comprising a second register;
a controller; and
a power gate configured to supply power to the timer circuit, the first register, the CPU, the second register, and the controller,
wherein the microcontroller is capable of being in:
a first mode, the first mode being a mode where the timer circuit, the first register, the CPU, the second register, and the controller operate;
a second mode, the second mode being a mode where the timer circuit, the first register, and the controller operate; and
a third mode, the third mode being a mode where the controller operates,
wherein the microcontroller is configured to shift from the first mode to one of the second and third modes by the CPU,
wherein the microcontroller is configured to shift from one of the second and third modes to the first mode by the controller, and
wherein the first register and the second register each comprises:
a first memory, wherein the first memory is a volatile memory; and
a second memory comprising a first transistor, wherein a channel formation region of the first transistor comprises a first oxide semiconductor layer.

2. The microcontroller according to claim 1,
wherein the CPU and the second register do not operate in the second mode, and
wherein the timer circuit, the first register, the CPU, and the second register do not operate in the third mode.

3. The microcontroller according to claim 1, further comprising:
an I/O port;
a third register electrically connected to the I/O port;
a comparator; and
a fourth register electrically connected to the comparator,
wherein the I/O port, the third register, the comparator, and the fourth register operate in the first mode, and do not operate in the second and third modes.

4. The microcontroller according to claim 1, further comprising:
an interrupt controller; and
a fifth register electrically connected to the interrupt controller,
wherein the interrupt controller and the fifth register operate in the first mode, and do not operate in the second and third modes.

5. The microcontroller according to claim 1, further comprising:
an interrupt controller; and
a fifth register electrically connected to the interrupt controller,
wherein the interrupt controller and the fifth register operate in the first mode, and do not operate in the second and third modes, and
wherein the fifth register comprises:
a third memory, wherein the third memory is a volatile memory; and
a fourth memory comprising a second transistor,
wherein a channel formation region of the second transistor comprises a second oxide semiconductor layer.

6. The microcontroller according to claim 1, further comprising:
a RAM electrically connected to the CPU,
wherein the RAM comprising a third transistor, and
wherein a channel formation region of the third transistor comprises a third oxide semiconductor layer.

7. The microcontroller according to claim 1,
wherein the timer circuit is configured to output a signal at regular intervals, and
wherein the microcontroller is configured to shift from the second mode to the first mode by the controller in accordance with the signal supplied from the timer circuit.

8. The microcontroller according to claim 1,
wherein the second memory is configured to back up a data stored in the first memory before power supply is stopped by the power gate, and
wherein the data backed up in the second memory is written into the first memory in a case where power supply is started again by the power gate.

9. The microcontroller according to claim 1,
wherein the first oxide semiconductor layer comprises indium, gallium, and zinc.

10. A microcontroller comprising:
a timer circuit;
a first register electrically connected to the timer circuit;
a CPU comprising a second register;
a controller; and
a power gate configured to supply power to the timer circuit, the first register, the CPU, the second register, and the controller,
wherein the microcontroller is capable of being in:
a first mode, the first mode being a mode where the timer circuit, the first register, the CPU, the second register, and the controller operate;
a second mode, the second mode being a mode where the timer circuit, the first register, and the controller operate; and
a third mode, the third mode being a mode where the controller operates,
wherein the microcontroller is configured to shift from the first mode to one of the second and third modes by the CPU,
wherein the microcontroller is configured to shift from one of the second and third modes to the first mode by the controller, and
wherein the first register and the second register each comprises:
a first memory, wherein the first memory is a volatile memory; and
a second memory comprising a first transistor and a fourth transistor,
wherein a channel formation region of the first transistor comprises a first oxide semiconductor layer, and
wherein a channel formation region of the fourth transistor comprises single crystal silicon.

11. The microcontroller according to claim 10,
wherein the CPU and the second register do not operate in the second mode, and
wherein the timer circuit, the first register, the CPU, and the second register do not operate in the third mode.

12. The microcontroller according to claim 10, further comprising:
an I/O port;
a third register electrically connected to the I/O port;
a comparator; and
a fourth register electrically connected to the comparator,
wherein the I/O port, the third register, the comparator, and the fourth register operate in the first mode, and do not operate in the second and third modes.

13. The microcontroller according to claim 10, further comprising:
an interrupt controller; and
a fifth register electrically connected to the interrupt controller,
wherein the interrupt controller and the fifth register operate in the first mode, and do not operate in the second and third modes.

14. The microcontroller according to claim 10, further comprising:
an interrupt controller; and
a fifth register electrically connected to the interrupt controller,
wherein the interrupt controller and the fifth register operate in the first mode, and do not operate in the second and third modes, and
wherein the fifth register comprises:
a third memory, wherein the third memory is a volatile memory; and
a fourth memory comprising a second transistor,
wherein a channel formation region of the second transistor comprises a second oxide semiconductor layer.

15. The microcontroller according to claim 10, further comprising:

a RAM electrically connected to the CPU,
wherein the RAM comprising a third transistor, and
wherein a channel formation region of the third transistor comprises a third oxide semiconductor layer.

16. The microcontroller according to claim 10,
wherein the timer circuit is configured to output a signal at regular intervals, and
wherein the microcontroller is configured to shift from the second mode to the first mode by the controller in accordance with the signal supplied from the timer circuit.

17. The microcontroller according to claim 10,
wherein the second memory is configured to back up a data stored in the first memory before power supply is stopped by the power gate, and
wherein the data backed up in the second memory is written into the first memory in a case where power supply is started again by the power gate.

18. The microcontroller according to claim 10,
wherein the first oxide semiconductor layer comprises indium, gallium, and zinc.

19. The microcontroller according to claim 1, wherein the second memory is a nonvolatile memory.

20. The microcontroller according to claim 5, wherein the fourth memory is a nonvolatile memory.

21. The microcontroller according to claim 10, wherein the second memory is a nonvolatile memory.

22. The microcontroller according to claim 14, wherein the fourth memory is a nonvolatile memory.

* * * * *